(12) United States Patent
Zhang et al.

(10) Patent No.: US 12,477,892 B2
(45) Date of Patent: Nov. 18, 2025

(54) LIGHT-EMITTING DEVICE AND METHOD FOR MANUFACTURING THE SAME, LIGHT-EMITTING SUBSTRATE AND LIGHT-EMITTING APPARATUS

(71) Applicant: BOE TECHNOLOGY GROUP CO., LTD., Beijing (CN)

(72) Inventors: Xiaojin Zhang, Beijing (CN); Xinghua Liu, Beijing (CN); Huiyun Yang, Beijing (CN); Changho Lee, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1025 days.

(21) Appl. No.: 17/614,745

(22) PCT Filed: Oct. 15, 2020

(86) PCT No.: PCT/CN2020/120999
§ 371 (c)(1),
(2) Date: Nov. 29, 2021

(87) PCT Pub. No.: WO2022/077299
PCT Pub. Date: Apr. 21, 2022

(65) Prior Publication Data
US 2022/0328782 A1 Oct. 13, 2022

(51) Int. Cl.
*H10K 101/40* (2023.01)
*H10K 50/11* (2023.01)
(Continued)

(52) U.S. Cl.
CPC ............. *H10K 50/13* (2023.02); *H10K 50/11* (2023.02); *H10K 50/15* (2023.02); *H10K 50/16* (2023.02);
(Continued)

(58) Field of Classification Search
CPC . H01L 51/5016; H01L 51/5004; H01L 51/56; H01L 51/5072; H01L 51/5056;
(Continued)

(56) References Cited

U.S. PATENT DOCUMENTS

2019/0115398 A1    4/2019  Tsukamoto et al.
2019/0228686 A1*   7/2019  Tsukamoto ............ H05B 33/10
2019/0326540 A1   10/2019  Tsukamoto et al.

OTHER PUBLICATIONS

PCT International Search Report and Written Opinion for corresponding Application No. PCT/CN2020/120999, 8 pages, (2021).

* cited by examiner

*Primary Examiner* — Michael B Cleveland
(74) *Attorney, Agent, or Firm* — Dority & Manning, P.A.

(57) ABSTRACT

A light-emitting device includes a first light-emitting layer and a second light-emitting layer that are stacked. A material of the first light-emitting layer includes a first host material and a first TADF sensitizer. A material of the second light-emitting layer includes a second host material, a second TADF sensitizer, and a second fluorescent emissive material. Transmission rates of the material of the first light-emitting layer and the material of the second light-emitting layer to holes are greater than transmission rates of the material of the first light-emitting layer and the material of the second light-emitting layer to electrons, and there is a first overlapping region between a normalized electroluminescence spectrum of the first TADF sensitizer and a normalized absorption spectrum of the second fluorescent emissive material.

20 Claims, 8 Drawing Sheets

(51) Int. Cl.
  *H10K 50/13*  (2023.01)
  *H10K 50/15*  (2023.01)
  *H10K 50/16*  (2023.01)
  *H10K 85/60*  (2023.01)
  *H10K 101/10* (2023.01)
  *H10K 101/20* (2023.01)
  *H10K 71/00*  (2023.01)

(52) U.S. Cl.
  CPC ......... *H10K 85/6572* (2023.02); *H10K 71/00* (2023.02); *H10K 2101/10* (2023.02); *H10K 2101/20* (2023.02); *H10K 2101/40* (2023.02)

(58) Field of Classification Search
  CPC ..... H01L 51/0072; G09F 9/302; G09F 9/301; H05B 33/10; H05B 33/24
  See application file for complete search history.

LIGHT-EMITTING DEVICE AND METHOD FOR MANUFACTURING THE SAME, LIGHT-EMITTING SUBSTRATE AND LIGHT-EMITTING APPARATUS

CROSS-REFERENCE TO RELATED APPLICATION

This application is a national phase entry under 35 USC 371 of International Patent Application No. PCT/CN2020/120999 filed on Oct. 15, 2020, which is incorporated herein by reference in its entirety.

TECHNICAL FIELD

The present disclosure relates to the field of illumination and display technologies, and in particular, to a light-emitting device and a method for manufacturing the same, a light-emitting substrate and a light-emitting apparatus.

BACKGROUND

An organic light-emitting diode (OLED) has characteristics of self-luminescence, wide visible angle, fast response time, high luminous efficiency, low operating voltage, small substrate thickness, capability of constituting a large size and flexible substrate, simple manufacturing process and the like, and thus is known as a next-generation "star" display technology.

SUMMARY

In an aspect, a light-emitting device is provided. The light-emitting device includes a first light-emitting layer and a second light-emitting layer that are stacked, a hole transport layer located on a side of the first light-emitting layer away from the second light-emitting layer, and an electron transport layer located on a side of the second light-emitting layer away from the first light-emitting layer. A material of the first light-emitting layer includes a first host material and a first TADF sensitizer, and a material of the second light-emitting layer includes a second host material, a second TADF sensitizer, and a second fluorescent emissive material. Transmission rates of the material of the first light-emitting layer and the material of the second light-emitting layer to holes are both greater than transmission rates of the material of the first light-emitting layer and the material of the second light-emitting layer to electrons, and a normalized electroluminescence spectrum of the first TADF sensitizer and a normalized absorption spectrum of the second fluorescent emissive material have a first overlapping region therebetween.

In some embodiments, an area of the first overlapping region is greater than 70% of an area of the normalized absorption spectrum of the second fluorescent emissive material; and/or, a difference between a peak wavelength of an absorption peak with a lowest energy in the normalized absorption spectrum of the second fluorescent emissive material and a peak wavelength of an emission peak with a highest energy in the normalized electroluminescence spectrum of the first TADF sensitizer is less than or equal to 25 nm.

In some embodiments, a lowest singlet energy of the second host material, a lowest singlet energy of the second TADF sensitizer, a lowest singlet energy of the second fluorescent emissive material, a lowest triplet energy of the second host material, a lowest triplet energy of the second TADF sensitizer, and a lowest triplet energy of the second fluorescent emissive material meet:

$S1(D)-T1(D)>0.2$ eV;

$S1(E)-T1(E)<0.2$ eV;

$S1(F)-T1(F)>0.2$ eV;

$S1(D)>S1(E)>S1(F)$; and $T1(D)>T1(E)>T1(F)$, where S1 represents a low singlet energy, T1 represents a lowest triplet energy, D represents the second host material, E represents the second TADF sensitizer, and F represents the second fluorescent emissive material.

In some embodiments, the first TADF sensitizer and the second TADF sensitizer are the same or different. In a case where the first TADF sensitizer and the second TADF sensitizer are different, a normalized electroluminescence spectrum of the second TADF sensitizer and the normalized absorption spectrum of the second fluorescent emissive material have a second overlapping region therebetween.

In some embodiments, an area of the second overlapping region is greater than 70% of the area of the normalized absorption spectrum of the second fluorescent emissive material; and/or, a difference between the peak wavelength of the absorption peak with the lowest energy in the normalized absorption spectrum of the second fluorescent emissive material and a peak wavelength of an emission peak with a highest energy in the normalized electroluminescence spectrum of the second TADF sensitizer is less than or equal to 25 nm.

In some embodiments, wavelengths corresponding to peak wavelengths of emission peaks with the highest energy of the second host material, the second TADF sensitizer, and the second fluorescent emissive material meet:

$\lambda(D)>\lambda(E)>\lambda(F)$, where $\lambda$ represents a wavelength.

In some embodiments, a highest occupied molecular orbital (HOMO) energy level of the second host material and a HOMO energy level of the second TADF sensitizer, and a lowest unoccupied molecular orbital (LUMO) energy level of the second host material and a LUMO energy level of the second TADF sensitizer meet:

$|HOMO|(D)-|HOMO|(E)<0.2$ eV;

$|LUMO|(D)-|LUMO|(E)>0.3$ eV;

and/or,
a HOMO energy level of the first host material and a HOMO energy level of the first TADF sensitizer, and a LUMO energy level of the first host material and a LUMO energy level of the first TADF sensitizer meet:

$|HOMO|(A)-|HOMO|(B)<0.2$ eV; and $|LUMO|(B)-|LUMO|(A)>0.3$ eV, where |HOMO| represents an absolute value of a HOMO energy level, |LUMO| represents an absolute value of a LUMO energy level, A represents the first host material, and B represents the first TADF sensitizer.

In some embodiments, the second host material and the second TADF sensitizer meet the following relations:

$||HOMO|(D)-|LUMO|(E)-S1(E)|\leq 0.2$ eV;

$||HOMO|(D)-|LUMO|(E)-T1(E)|\leq 0.2$ eV;

and/or,
the first host material and the first TADF sensitizer meet the following relations:

$||HOMO|(A)-|LUMO|(B)-S1(B)|\leq 0.2$ eV; and $||HOMO|(A)-|LUMO|(B)-T1(B)|\leq 0.2$ eV.

In some embodiments, the second host material and the first TADF sensitizer meet the following relations:

$||HOMO|(D)-|LUMO|(B)-S1(B)|\leq 0.2$ eV;

$||HOMO|(D)-|LUMO|(B)-T1(B)|\leq 0.2$ eV;

and/or,
the first host material and the second TADF sensitizer meet the following relations:

$||HOMO|(A)-|LUMO|(E)-S1(E)|\leq 0.2$ eV; and $||HOMO|(A)-|LUMO|(E)-T1(E)|\leq 0.2$ eV.

In some embodiments, the first host material and the second host material are the same, the first TADF sensitizer and the second TADF sensitizer are the same, and a mass ratio of the first TADF sensitizer to the first host material is less than a mass ratio of the second TADF sensitizer to the second host material.

In some embodiments, the first TADF sensitizer and the second TADF sensitizer are different, a lowest triplet energy of the first TADF sensitizer and a lowest triplet energy of the second TADF sensitizer, and a lowest singlet energy of the first TADF sensitizer and a lowest singlet energy of the second TADF sensitizer meet:

$|T1(E)-T1(B)|<0.2$ eV;

$|S1(E)-S1(B)|<0.2$ eV;

and/or,
under same test conditions, a luminous efficiency of a luminescence system composed of the first host material and the first TADF sensitizer is greater than a luminous efficiency of a luminescence system composed of the second host material and the second TADF sensitizer.

In some embodiments, the first light-emitting layer further includes a first fluorescent emissive material. A lowest singlet energy of the first host material, a lowest singlet energy of the first TADF sensitizer, a lowest singlet energy of the first fluorescent emissive material, a lowest triplet energy of the first host material, a lowest triplet energy of the first TADF sensitizer, and a lowest triplet energy of the first fluorescent emissive material meet:

$S1(A)-T1(A)>0.2$ eV;

$S1(B)-T1(B)<0.2$ eV;

$S1(C)-T1(C)>0.2$ eV;

$S1(A)>S1(B)>S1(C)$;

$T1(A)>T1(B)>T1(C)$;

wherein the first fluorescent emissive material and the second fluorescent emissive material are the same.

In some embodiments, in a case where the first fluorescent emissive material C and the second fluorescent emissive material F are the same, and the second TADF sensitizer and the first TADF sensitizer are the same, and the first host material and the second host material are the same, a mass percentage of the first fluorescent emissive material in the first light-emitting layer is greater than a mass percentage of the second fluorescent emissive material in the second light-emitting layer.

In some embodiments, a difference between the mass percentage of the first fluorescent emissive material in the first light-emitting layer and the mass percentage of the second fluorescent emissive material in the second light-emitting layer is greater than or equal to 0.1%.

In some embodiments, the mass percentage of the first fluorescent emissive material in the first light-emitting layer is within a range of 0.5% to 3%, inclusive, and the mass percentage of the second fluorescent emissive material in the second light-emitting layer is within a range of 0.5% to 3%, inclusive.

In some embodiments, a thickness of the first light-emitting layer is less than a thickness of the second light-emitting layer.

In some embodiments, the light-emitting device further includes a hole blocking layer located between the electron transport layer and the second light-emitting layer; and/or, an electron blocking layer located between the hole transport layer and the first light-emitting layer.

In some embodiments, in a case where the light-emitting device includes the electron blocking layer, a lowest triplet energy of the electron blocking layer is greater than a lowest triplet energy of the first TADF sensitizer, and a difference between the two is greater than 0.2 eV. In a case where the light-emitting device includes the hole blocking layer, a lowest triplet energy of the hole blocking layer is greater than a lowest triplet energy of the second TADF sensitizer, and a difference between the two is greater than 0.2 eV.

In some embodiments, in a case where the light-emitting device includes the hole blocking layer, an absolute value of a HOMO energy level of the hole blocking layer is greater than an absolute value of a HOMO energy level of the second host material by 0.2 eV. In a case where the light-emitting device includes the electron blocking layer, an energy level difference between a HOMO energy level of the electron blocking layer and a HOMO energy level of the first host material is less than or equal to 0.2 eV.

In another aspect, a light-emitting substrate is provided, including the light-emitting device described above.

In yet another aspect, a light-emitting apparatus is provided, including the light-emitting substrate described above.

In yet another aspect, a method for manufacturing a light-emitting device is provided, and the method includes:

forming a hole transport layer, a first light-emitting layer, a second light-emitting layer, and an electron transport layer that are sequentially stacked. A material of the first light-emitting layer includes a first host material and a first TADF sensitizer. A material of the second light-emitting layer includes a second host material, a second TADF sensitizer, and a second fluorescent emissive material. Transmission rates of the material of the first light-emitting layer and the material of the second light-emitting layer to holes are greater than transmission rates of the material of the first light-emitting layer and the material of the second light-emitting layer to electrons, and a normalized electroluminescence spectrum of the second fluorescent emissive material and a normalized absorption spectrum of the first TADF sensitizer have a first overlapping region therebetween.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
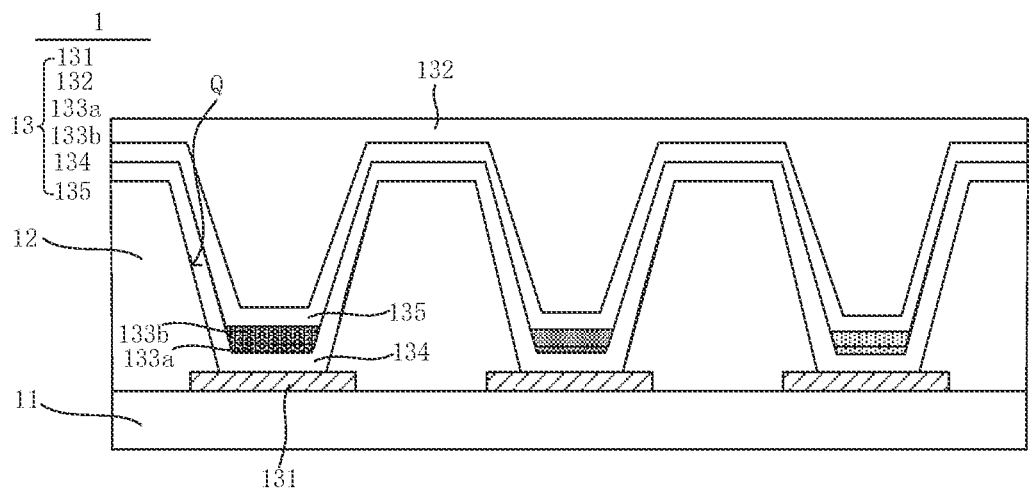
FIG. 1 is a sectional structural view of a light-emitting substrate, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art on the basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, terms such as "first" and "second" are only used for descriptive purposes, and are not to be construed as indicating or implying relative importance or implicitly indicating the number of indicated technical features. Thus, features defined as "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", and they both include the following combinations of A, B and C only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about" or "approximately" as used herein includes a stated value and an average value within an acceptable deviation range of a particular value. The acceptable deviation range is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thickness of layers and regions may be exaggerated for clarity. Therefore, variations in shape with respect to the drawings due to, for example, manufacturing technologies and/or tolerances may be conceivable. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

In some embodiments of the present disclosure, a light-emitting apparatus is provided. The light-emitting apparatus includes a light-emitting substrate. Of course, it may further include other components, such as a circuit for providing electrical signals to the light-emitting substrate to drive the light-emitting substrate to emit light. The circuit may be referred to as a control circuit, and may include a circuit board and/or an integrated circuit (IC) electrically connected to the light-emitting substrate.

In some embodiments, the light-emitting apparatus may be an illumination apparatus. In this case, the light-emitting apparatus is served as a light source to achieve an illumination function. For example, the light-emitting apparatus may be a backlight module in a liquid crystal display apparatus, a lamp for internal or external illumination, or a signal lamp.

In some other embodiments, the light-emitting apparatus may be a display apparatus. In this case, the light-emitting substrate is a display substrate for achieving a function of displaying images (i.e., pictures), The light-emitting apparatus may include a display or a product including the display. The display may be a flat panel display (FPD), a micro display, etc. If the display is classified according to whether users can see a scene behind a back of the display, the display may be a transparent display or an opaque display. If the display is classified according to whether the display may be bent or curled, the display may be a flexible display or a common display (which may be referred to as a rigid display). For example, the product including the display may be a computer display, a television, a billboard, a laser printer with a display function, a telephone, a mobile phone, a personal digital assistant (FDA), a laptop computer, a digital camera, a camcorder, a viewfinder, a vehicle, a large-area wall, a screen in a theater, or a sign in a stadium.

In some embodiments of the present disclosure, a light-emitting substrate is provided. As shown in FIG. 1, the light-emitting substrate 1 may include a base 11, and a pixel define layer 12 and a plurality of light-emitting devices 13 that are all disposed on the base 11. The pixel define layer 12 has a plurality of openings Q. Multiple light-emitting devices 13 may be arranged in one-to-one correspondence with multiple openings Q. The multiple light-emitting devices 13 here may be all or some of the plurality of light-emitting devices 13 included in the light-emitting substrate 1. The multiple openings may be all or some of the plurality of openings in the pixel define layer 12.

In some embodiments, the base 11 may be made of glass, sapphire (alumina), polyimide, silicon wafer, or the like.

In some embodiments, as shown in FIG. 1, each light-emitting device 13 includes a first electrode 131 (an anode), a hole transport layer 134, a first light-emitting layer 133a, a second light-emitting layer 133b, an electron transport layer 135 and a second electrode 132 (a cathode) that are sequentially stacked.

In some embodiments, a material of the anode may be selected from a material having a high work function, such as indium tin oxide (ITO), indium zinc oxide (IZO) or a composite material (e.g., Ag/ITO, Al/ITO, Ag/IZO or Al/IZO, where "Ag/ITO" is a laminated structure formed by a metallic silver electrode and an ITO electrode that are stacked). A material of the cathode may be selected from a material having a low work function, such as metal Al, Ag or Mg, or a metal alloy material having a low work function (e.g., magnesium aluminum alloy, or magnesium silver alloy).

In some embodiments, for each light-emitting device 13, the anode is closer to the base 11 relative to the cathode, or the cathode is closer to the base 11 relative to the anode. That is, the light-emitting substrate 1 may be an "upright" light-emitting substrate or an "inverted" light-emitting substrate.

In a case where the anode is closer to the base 11 relative to the cathode, the light-emitting substrate 1 is an "upright" light-emitting substrate. In a case where the cathode is closer to the base 11 relative to the anode, the light-emitting substrate 1 is an "inverted" light-emitting substrate.

According to whether the first electrode 131 and the second electrode 132 transmit light, the light-emitting substrate 1 may be further classified into a bottom-emission light-emitting substrate, a top-emission light-emitting substrate, or a double-emission light-emitting substrate.

For example, the light-emitting substrate 1 is an "upright" light-emitting substrate. In a case where the first electrode 131 is selected from a transparent electrode, such as ITO or IZO, and the second electrode 132 is selected from a metal electrode with a large thickness (in this case, the second electrode 132 may be regarded as a reflective electrode), such as magnesium aluminum alloy with a thickness of more than 80 nm, the light-emitting substrate 1 is a bottom-emission light-emitting substrate. In a case where the first electrode 131 is selected from a laminated structure with a large thickness (in this case, the first electrode 131 may be regarded as the reflective electrode), such as Ag/ITO, Al/ITO, Ag/IZO or Al/IZO, and the second electrode 132 is selected from a metal electrode with a small thickness, such as magnesium aluminum alloy with a thickness within a range of 10 nm to 20 nm, inclusive, the light-emitting substrate 1 is a top-emission light-emitting substrate. Of course, in a case where the first electrode 131 is selected from the transparent electrode and the second electrode 132 is selected from a metal electrode with a small thickness, the light-emitting substrate 1 is a double-emission light-emitting substrate.

Here, it will be noted that, in a case where the light-emitting substrate 1 is a bottom-emission light-emitting substrate, the base 11 may be made of a material with a light transmittance greater than 85%, such as glass.

Figure 2:
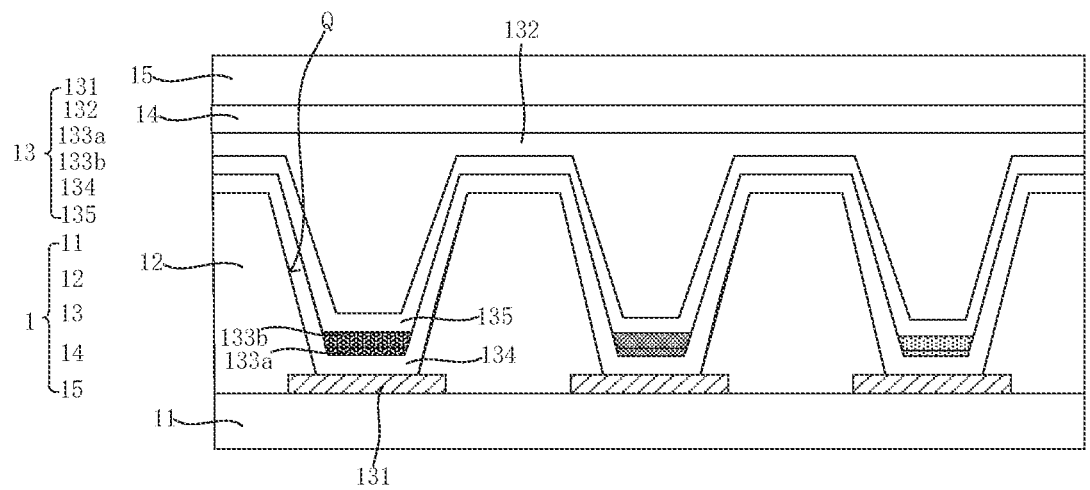
FIG. 2 is a sectional structural view of a light-emitting substrate, in accordance with some other embodiments.

Further, in a case where the light-emitting substrate 1 is a top-emission light-emitting substrate, as shown in FIG. 2, the light-emitting substrate 1 may further include an optical capping layer (CPL) 14 disposed on a side of the second electrode 132 away from the first electrode 131. A refractive index of the optical capping layer 14 is greater than 1.8, and a thickness thereof is within a range of 50 nm to 100 nm, inclusive. The optical capping layer 14 can improve optical output.

In addition, in the case where the light-emitting substrate 1 is a top-emission light-emitting substrate, thicknesses of the first light-emitting layer 133a and the second light-emitting layer 133b may be adjusted, so that the thicknesses of the first light-emitting layer 133a and the second light-emitting layer 133b meet optical path requirements of an optical micro resonant cavity, thereby obtaining a better luminous intensity and color.

In some embodiments, as shown in FIG. 2, the light-emitting substrate 1 may further include an encapsulation layer 15. The encapsulation layer 15 may be an ultraviolet ray (UV) sealant or an encapsulation film. The UV sealant is also referred to as UV glue. The optical capping layer 14 may be disposed on a side of the encapsulation layer 15 away from the second electrode 132 or may be disposed on a side of the encapsulation layer 15 proximate to the second electrode 132.

In some embodiments, a material of the first light-emitting layer 133a includes a first host material A and a first thermally activated delayed fluorescence (TADF) sensitizer B. A material of the second light-emitting layer 133b includes a second host material D, a second TADF sensitizer E and a second fluorescent emissive material F. Transmission rates of the material of the first light-emitting layer 133a and the material of the second light-emitting layer 133b to holes are both greater than transmission rates of the material of the first light-emitting layer 133a and the material of the second light-emitting layer 133b to electrons. There is a first overlapping region between a normalized electroluminescence spectrum of the first TADF sensitizer B and a normalized absorption spectrum of the second fluorescent emissive material F.

The host material refers to a material with a largest mass ratio in a host-guest doping system. The TADF sensitizer is a material with TADF properties. The material with TADF properties is a material with a small energy gap between a singlet excited state and a triplet excited state. In such a material, sufficient reverse intersystem crossing from the triplet excited state to the singlet excited state is generated through thermal excitation, so as to transform triplet excitons into singlet excitons, which can make full use of energy of the triplet excitons.

Fluorescence resonance energy transfer (which is also referred to as Forster energy transfer) means that, in two different fluorophores, if an emission spectrum of one fluorophore (Donor) overlaps with an absorption spectrum of another fluorophore (Acceptor), in a case where a distance between the two fluorophores is suitable (generally less than 100 Å), a phenomenon that fluorescence energy is transferred from the donor to the acceptor may be observed. That is, if the donor is excited with excitation light, intensity of fluorescence generated by the donor is much lower than that when it exists alone, but fluorescence emitted by the acceptor is greatly enhanced, and simultaneously their fluorescence lifetimes are shortened and prolonged, respectively. Simply put, it is a process of transferring energy of the donor in an excited state from the donor to the acceptor through a pair of dipoles. Such a process does not involve photons, so it is non-radiative. In a case where an acceptor molecule and a donor molecule are separated by a certain distance, and an energy difference between vibrational energy levels of a ground state and a first electronic excited state of the donor and an energy difference between vibrational energy levels of the around state and the first electronic excited state of the acceptor are adapt to each other, if the donor molecule is excited, the donor in the excited state transfers part or all of its energy to the acceptor, so that the acceptor is excited. The entire energy transfer process does not involve emission and re-absorption of the photons.

An electroluminescence spectrum of the first TADF sensitizer B is a spectrum of light that may be emitted by a light-emitting device in an energized state in a case where the light-emitting device is manufactured by doping the first TADF sensitizer B into the first host material A in a certain ratio (e.g., 20%). The spectrum may reflect a range of wavelengths (as an abscissa) of light emitted by the first TADF sensitizer B and a light intensity (as an ordinate) corresponding to each wavelength in the range of wavelengths.

The absorption spectrum of the second fluorescent emissive material F is a spectrum of light that may be absorbed by a thin sheet made of the second fluorescent emissive material F under the irradiation of light within a wavelength range of 200 nm to 800 nm (including ultraviolet rays and visible light). The spectrum may reflect absorption intensities (as the ordinate) of the second fluorescent emissive material F to light of different wavelengths (as the abscissa) under the irradiation of light within the wavelength range of 200 nm to 800 nm.

A normalization of a spectrum is to normalize the spectrum. That is, a total light intensity is set to one, so that all the light intensities on the ordinate become decimals. A spectrum obtained in such a way is a normalized spectrum.

According to the first overlapping region between the electroluminescence spectrum of the first TADF sensitizer B and the absorption spectrum of the second fluorescent emissive material F, it can be seen that, energy of singlet excitons of the first TADF sensitizer B may be transferred to singlet excitons of the second fluorescent emissive material F through Forster energy transfer, and then transition of the singlet excitons of the second fluorescent emissive material F back to the ground state occurs to emit light. Therefore, the first TADF sensitizer Bis served as the donor, the second fluorescent emissive material F is served as the acceptor, and the conditions for the Forster energy transfer are met. That is, the first TADF sensitizer B and the second fluorescent emissive material F are both fluorescent emissive materials. Due to excitation of the emission spectrum of the first TADF sensitizer B, fluorescence emitted by the second fluorescent emissive material F is greatly enhanced and a fluorescence lifetime of the second fluorescent emissive material is increased, but fluorescence emitted by the first TADF sensitizer B is reduced and a fluorescence lifetime of the first TADF sensitizer is reduced.

In the embodiments, according to a situation that the transmission rates of the material of the first light-emitting layer 133a and the material of the second light-emitting layer 133b to the holes are both greater than the transmission rates of the material of the first light-emitting layer 133a and the material of the second light-emitting layer 133b to the electrons, it can be seen that, in a case where the holes and the electrons are respectively injected from surfaces of the first light-emitting layer 133a and the second light-emitting layer 133b that are away from each other simultaneously and start to transport, since the transmission rate of the hole is greater than the transmission rate of the electron, the holes and the electrons are more likely to meet in a light-emitting layer closer to the electron transport layer 135. That is, the holes and the electrons are more likely to meet at the second light-emitting layer 133b. Therefore, compared with the first light-emitting layer 133a, the holes and the electrons (i.e., the electrons and the holes) are more likely to recombine at the second light-emitting layer 133b to generate excitons.

Therefore, in a case where a small amount of holes and electrons recombine at the first light-emitting layer 133a to generate excitons to make the first TADF sensitizer B emit light, most of the holes and the electrons recombine at the second light-emitting layer 133b to generate excitons to make the second fluorescent emissive material F emit light. In this case, it is assumed that the light-emitting device 13 includes only one light-emitting layer (i.e., a material and a composition ratio at the position where the first light-emitting layer 133a is located and a material and a composition ratio at the position where the second light-emitting layer 133b is located are completely the same), luminous efficiency of the light-emitting device 13 completely depends on luminous efficiency of the material at the position where the second light-emitting layer 133b is located. However, in the embodiments, since the material and the composition ratio of the first light-emitting layer 133a and the material and the composition ratio of the second light-emitting layer 133b are not completely the same, and there is the first overlapping region between the normalized electroluminescence spectrum of the first TADF sensitizer B and the normalized absorption spectrum of the second fluorescent emissive material F, the energy of the singlet excitons of the first TADF sensitizer B can be transferred to the singlet excitons of the second fluorescent emissive material F through Forster energy transfer, which greatly enhances the fluorescence emitted by the second fluorescent emissive material F, and increases service life of the device. Compared with a single-layered light-emitting layer, energy generated by a small amount of excitons can be used to enhance the fluorescence emitted by the second fluorescent emissive material F, which improves the fluorescence lifetime. As a result, it is possible to solve a problem that the luminous efficiency of the light-emitting device cannot be improved due to little contribution of a small amount of excitons to light emission and the inability to achieve energy transmission in the related art.

In some embodiments, the first host material A and the second host material D may be the same or different. Correspondingly, the first TADF sensitizer B and the second TADF sensitizer E may also be the same or different.

In a case where the first host material A and the second host material D are the same, the first host material A and the second host material D may both be thermally activated delayed fluorescent (TADF) materials or traditional fluorescent materials (which is different from the TADF materials). In this case, the first host material A and the second host material D may both be monomeric materials or materials in a form of exciplex. In a case where the first host material A and the second host material D are both monomeric materials, molecular structures of the first host material A and the second host material D are the same. In a case where the first host material A and the second host material D are both materials in the form of exciplex, the molecular structures and compositions of the first host material A and the second host material D are the same.

In a case where the first host material A and the second host material D are different, the first host material A and the second host material D meet:

|HOMO(A)−HOMO(D)|<0.2 eV; and

|T1(A)−T1(D)|<0.1 eV.

In this case, in the case where the first host material A and the second host material D are both monomeric materials, the molecular structures of the first host material A and the second host material D are different. The first host material A and the second host material D may both be the TADF materials or the traditional fluorescent materials. Alternatively, the first host material A and the second host material D are the TADF material and the traditional fluorescent material, respectively. In the case where the first host material A and the second host material D are both materials in the form of exciplex, a molecular structure of at least one of an electron donor molecule and an electron acceptor molecule in the first host material A is different from a molecular structure of corresponding one(s) of an electron donor molecule and an electron acceptor molecule in the second host material D, and/or a mixing ratio between electron donor molecules and electron acceptor molecules in the first host material A is different from a mixing ratio between electron donor molecules and electron acceptor molecules in the second host material D. In this case, the electron donor molecule and the electron acceptor molecule may both be the TADF materials or the traditional fluorescent materials, or the electron donor molecule and the electron acceptor molecule may be the TADF material and the traditional fluorescent material, respectively.

In the embodiments, highest occupied molecular orbital (HOMO) energy levels of the first host material A and the second host material D are not much different, which is convenient to inject holes of the first host material A onto the second host material D, so as to facilitate the recombination of the holes and the electrons on the second host material D, and improve luminous efficiency of the second fluorescent emissive material F, and avoid a problem that the holes and the electrons cannot normally recombine on the second host material D.

Meanwhile, since the energy of the triplet excitons of the first host material A and the second host material D is not much different, the excitons may freely transfer between the first light-emitting layer 133a and the second light-emitting layer 133b, which is conducive to enlarging an area of a light-emitting region.

Here, it will be noted that, for the exciplex, the HOMO energy level of the exciplex is a HOMO energy level with a smaller absolute value in the electron donor molecule and the electron acceptor molecule (i.e., a deeper HOMO energy level in the electron donor molecule and the electron acceptor molecule). A lowest unoccupied molecular orbital (LUMO) energy level of the exciplex is a LUMO energy level with a larger absolute value in the electron donor molecule and the electron acceptor molecule (i.e., a shallower LUMO energy level in the electron donor molecule and the electron acceptor molecule).

On this basis, in some embodiments, the first host material A and the second host material D may be independently selected from carbazole derivatives or arylsilane derivatives, such as 3,3'-Di(9H-carbazol-9-yl)biphenyl, 1,3-Di-9-carbazolylbenzene and 4,4'-Bis(N-carbazolyl)-1,1'-biphenyl.

In the case where the first TADF sensitizer B and the second TADF sensitizer E are the same, both the first TADF sensitizer B and the second TADF sensitizer E may also be monomeric materials or materials in the form of exciplex. In a case where both the first TADF sensitizer B and the second TADF sensitizer E are monomeric materials, molecular structures of the first TADF sensitizer B and the second TADF sensitizer E are the same. In the case where the first TADF sensitizer B and the second TADF sensitizer E are both the materials in the form of exciplex, in the first TADF sensitizer B and the second TADF sensitizer E, molecular structures of electron donor molecules are the same, molecular structures of electron acceptor molecules are the same, and mixing ratios of the electron donor molecules and the electron acceptor molecules are the same. In this case, a difference between triplet energy and singlet energy of the first TADF sensitizer B, and a difference between triplet energy and singlet energy of the second TADF sensitizer E are both small, and both the first TADF sensitizer B and the second TADF sensitizer E may generate delayed fluorescence. Moreover, in the case where the first TADF sensitizer B and the second TADF sensitizer E are the same, according to the first overlapping region between the normalized electroluminescence spectrum of the first TADF sensitizer B and the normalized absorption spectrum of the second fluorescent emissive material F, it can be seen that, there is also a first overlapping region between a normalized electroluminescence spectrum of the second TADF sensitizer E and the normalized absorption spectrum of the second fluorescent emissive material F. That is, energy of singlet excitons of the second TADF sensitizer E may also be transferred to the singlet excitons of the second fluorescent emissive material F through Forster energy transfer, so as to further improve the luminous efficiency and the fluorescence lifetime.

In a case where the first TADF sensitizer B and the second TADF sensitizer E are different, there is a second overlapping region between the normalized electroluminescence spectrum of the second TADF sensitizer E and the normalized absorption spectrum of the second fluorescent emissive material F.

In this case, in a case where the first TADF sensitizer B and the second fluorescent emissive material F are both the materials in the form of exciplex, similar to the first host material A and the second host material D, a molecular structure of at least one of an electron donor molecule and an electron acceptor molecule in the first TADF sensitizer B is different from a molecular structure of corresponding one(s) of an electron donor molecule and an electron acceptor molecule in the second fluorescent emissive material F, and/or, a mixing ratio between the electron donor molecules and the electron acceptor molecules in the first TADF sensitizer B is different from a mixing ratio between the electron donor molecules and the electron acceptor molecules in the second fluorescent emissive material F. In this case, a difference between triplet energy and singlet energy of the first TADF sensitizer B, and a difference between triplet energy and singlet energy of the second TADF sensitizer E are both small, and both the first TADF sensitizer B and the second TADF sensitizer E may generate delayed fluorescence. Moreover, in this case, according to the second overlapping region between the normalized electroluminescence spectrum of the second TADF sensitizer E and the normalized absorption spectrum of the second fluorescent emissive material F, the energy of the singlet excitons of the second TADF sensitizer E may also be transferred to the singlet excitons of the second fluorescent emissive material F through Forster energy transfer, which can improve the fluorescence intensity and the fluorescence lifetime of the second fluorescent emissive material F.

On this basis, in some embodiments, the first TADF sensitizer B and the second TADF sensitizer E may be independently selected from triazines, pyridines, ketones, quinones, furans and other derivatives with one or more D-A structures, such as any one of 3,4,5,6-tetrakis(3,6-di-t-Butylcarbazol-9-yl)-1,2-dicyanobenzene, and 2,3,5,6-tetrakis(carbazol-9-yl)-1,4-dicyanobenzene.

In some embodiments, an area of the second overlapping region is greater than 70% of an area of the normalized absorption spectrum of the second fluorescent emissive material F; and/or, a difference between a peak wavelength of an absorption peak with the lowest energy in the normalized absorption spectrum of the second fluorescent emissive material F and a peak wavelength of an emission peak with the highest energy in the normalized electroluminescence spectrum of the second TADF sensitizer E is less than or equal to 25 nm. In the embodiments, sufficient Forster energy transfer from the second TADF sensitizer E to the second fluorescent emissive material F can occur, so that color purity of light emitted by the second fluorescent emissive material F can be improved.

Here, for example, the first host material A and the second host material D are the same and are both TM, and TM is selected from 3,3'-Di(9H-carbazol-9-yl)biphenyl. In the case where the first TADF sensitizer B and the second TADF sensitizer E are the same, for example, in the case where the first TADF sensitizer B and the second TADF sensitizer E may both be TH-1, TH-1 may be selected from 3,4,5,6-tetrakis(3,6-di-t-Butylcarbazol-9-yl)-1,2-dicyanobenzene.

Figure 3:
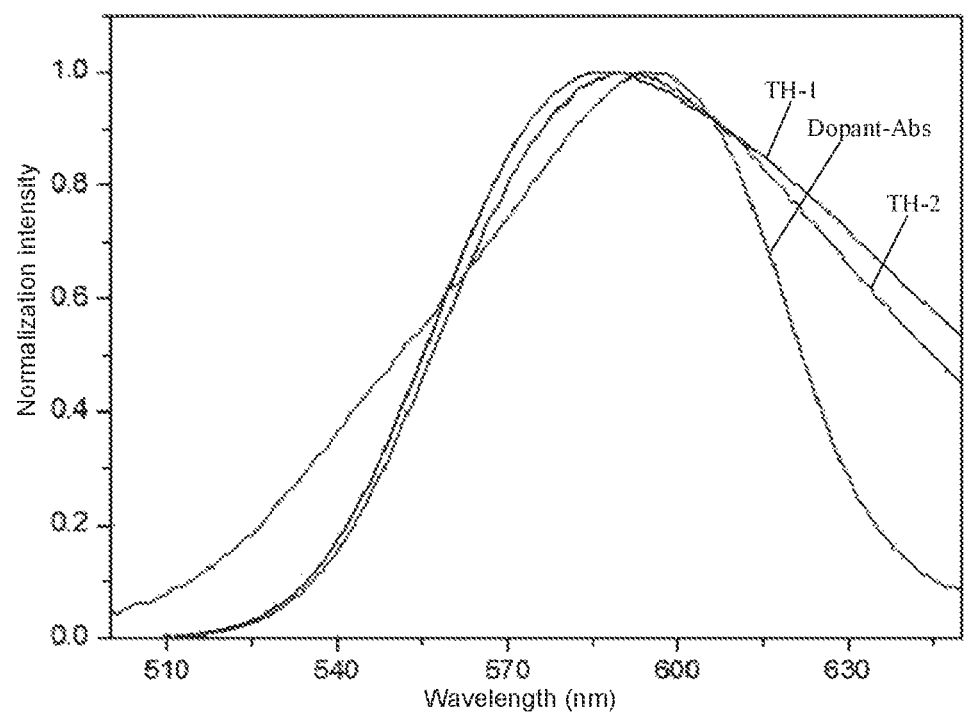
FIG. 3 is a comparison diagram of normalized electroluminescence spectra of TH-1 and TH-2 and a normalized absorption spectrum of Dopant, in accordance with some embodiments.

In this case, a normalized electroluminescence spectrum of TH-1 and the normalized absorption spectrum (Dopant-Abs) of the second fluorescent emissive material F (Dopant) are shown in FIG. 3. That is, the second overlapping region meets the above conditions. Moreover, the difference between the peak wavelength of the absorption peak with the lowest energy in the normalized absorption spectrum of the second fluorescent emissive material F and the peak wavelength of the emission peak with the highest energy in the normalized electroluminescence spectrum of the second TADF sensitizer E is less than or equal to 20 nm. Therefore, sufficient energy transfer between the second TADF sensitizer E and the second fluorescent emissive material F occurs, which may improve color purity of light emitted by the second fluorescent emissive material F. Meanwhile, the first TADF sensitizer B and the second TADF sensitizer E are the same, and thus the above relations also exist between the first TADF sensitizer B and the second fluorescent emissive material F. Compared with a single-layered light-emitting layer, a small amount of excitons can be used to generate energy to enhance fluorescence emitted by the second fluorescent emissive material F, which improves the fluorescence lifetime. As a result, it is possible to solve the problem that the luminous efficiency of the light-emitting device cannot be improved due to little contribution of a small amount of excitons to light emission and the inability to achieve energy transmission in the related art.

However, in the case where the first TADF sensitizer B and the second TADF sensitizer E are different, according to the situation that Forster energy transfer from the first TADF sensitizer B to the second fluorescent material F may also occur, it can be seen that, a small amount of excitons can be used to generate energy to enhance the fluorescence emitted by the second fluorescent emissive material F compared with the single-layered light-emitting layer, which improves the fluorescence lifetime. As a result, it is possible to solve the problem that the luminous efficiency of the light-emitting device cannot be improved due to little contribution of a small amount of excitons to light emission and the inability to achieve energy transmission in the related art.

In some embodiments, an area of the first overlapping region is greater than 70% of the area of the normalized absorption spectrum of the second fluorescent emissive material F, and/or, a difference between the peak wavelength of the absorption peak with the lowest energy in the normalized absorption spectrum of the second fluorescent emissive material F and a peak wavelength of the emission peak with the highest energy in the electroluminescence spectrum of the first TADF sensitizer B is less than or equal to 25 nm. In the embodiments, sufficient energy transfer from the first TADF sensitizer B to the second fluorescent emissive material F can occur, so that the color purity of the light emitted by the second fluorescent emissive material F may be improved.

According to the situation that the first TADF sensitizer B and the second TADF sensitizer E may be the same or different, it can be seen that, in the case where the first TADF sensitizer B and the second TADF sensitizer E are the same, reference may be made to the above description that the area of the second overlapping region is greater than 70% of the area of the normalized absorption spectrum of the first fluorescent emissive material F, and/or, reference may be made to the above description that the difference between the peak wavelength of the absorption peak with the lowest energy in the normalized absorption spectrum of the second fluorescent emissive material F and the peak wavelength of the emission peak with the highest energy in the normalized electroluminescence spectrum of the second TADF sensitizer E is less than or equal to 25 nm.

In the case where the first TADF sensitizer B and the second TADF sensitizer E are different, since the area of the second overlapping region is greater than 70% of the area of the normalized absorption spectrum of the second fluorescent emissive material F, and/or, the difference between the peak wavelength of the absorption peak with the lowest energy in the normalized absorption spectrum of the second fluorescent emissive material F and the peak wavelength of the emission peak with the highest energy in the normalized electroluminescence spectrum of the second TADF sensitizer E is less than or equal to 25 nm, the luminous intensity, the fluorescence lifetime and the color purity of the second fluorescent emissive material F can be further improved on a basis that the area of the first overlapping region is greater than 70% of the area of the normalized absorption spectrum of the second fluorescent emissive material F, and/or, that the difference between the peak wavelength of the absorption peak with the lowest energy in the normalized absorption spectrum of the second fluorescent emissive material F and the peak wavelength of the emission peak with the highest energy in the electroluminescence spectrum of the first TADF sensitizer B is less than or equal to 25 nm.

Figure 4:
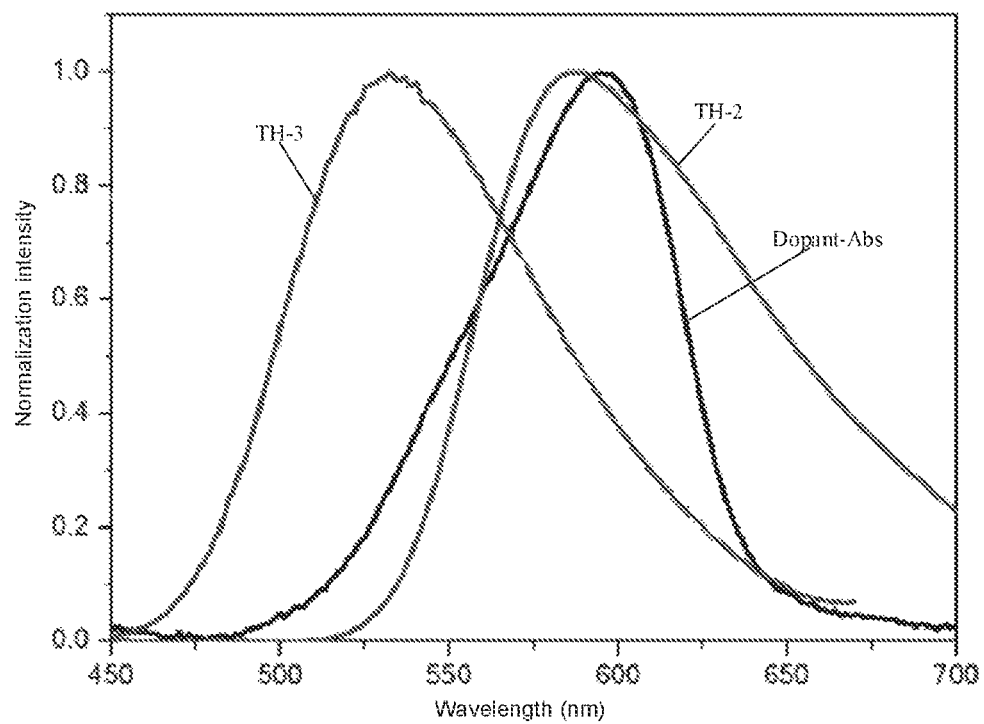
FIG. 4 is a comparison diagram of normalized electroluminescence spectra of TH-2 and TH-3 and a normalized absorption spectrum of Dopant, in accordance with some embodiments.
Figure 5:
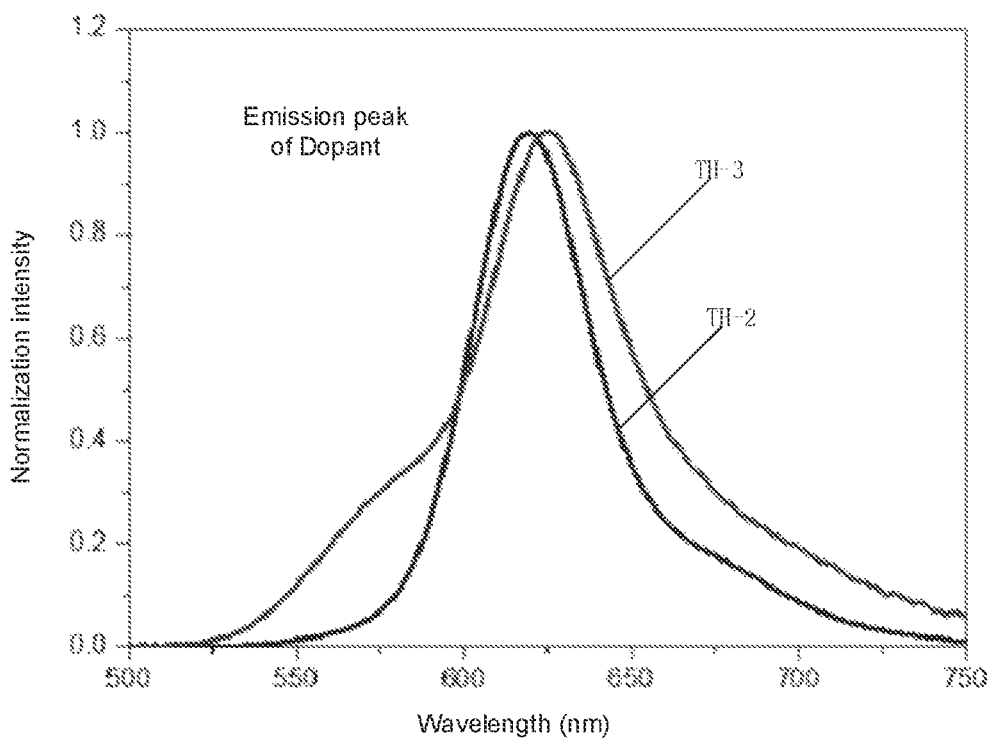
FIG. 5 is a comparison diagram of electroluminescence spectra of Dopant obtained in a case where a first TADF sensitizer B is TH-2 and TH-3, in accordance with some embodiments.

For example, the first host material A and the second host material are both selected from TM, and TM is selected from 3,3'-Di(9H-carbazol-9-yl)biphenyl, the second TADF sensitizer E is selected from TH-1, and TH-1 is selected from 3,4,5,6-tetrakis(3,6-di-t-Butylcarbazol-9-yl)-1,2-dicyanobenzene; the first TADF sensitizer B is selected from TH-2, and TH-2 is selected from 2,3,5,6-tetrakis(carbazol-9-yl)-1, 4-dicyanobenzene. A normalized electroluminescence spectrum of TH-2 and the normalized absorption spectrum of the second fluorescent emissive material F (Dopant) are shown in FIG. 3, and it can be seen that the area of the first overlapping region is greater than the area of the second overlapping region. However, with TH-3 as a comparative example, by measuring a normalized electroluminescence spectrum of TH-3 and the normalized absorption spectrum of the second fluorescent emissive material F (Dopant), which are shown in FIG. 4, it can be seen that an overlapping area between the normalized electroluminescence spectrum of TH-3 and the normalized absorption spectrum of the second fluorescent emissive material F (Dopant) is less than an overlapping area between the normalized electroluminescence spectrum of TH-2 and the normalized absorption spectrum of the second fluorescent emissive material F (Dopant). Correspondingly, as shown in FIG. 5, there is obviously an electroluminescence (EL) characteristic emission peak from TH-3 in an emission peak of a second fluorescent emissive material F of a light-emitting device made by such, and the color purity is poor. However, there is not an EL characteristic emission peak from TH-2 in an emission peak of a second fluorescent emissive material F of a light-emitting device made of TH-2 that is served as the first TADF sensitizer B, and the color purity is good.

In some embodiments, the lowest singlet energy S1 of the second host material D, the second TADF sensitizer E, and the second fluorescent emissive material F, and the lowest triplet energy T1 of the second host material D, the second TADF sensitizer E, and the second fluorescent emissive material F meet:

$S1(D)-T1(D)>0.2$ eV;

$S1(E)-T1(E)<0.2$ eV;

$S1(F)-T1(F)>0.2$ eV;

$S1(D)>S1(E)>S1(F)$; and $T1(D)>T1(E)>T1(F)$.

In the embodiments, the holes and the electrons recombine on the second host material D to form a large number of singlet excitons and triplet excitons. Energy of singlet excitons of the second host material D can be transferred to the singlet excitons of the second TADF sensitizer E through Forster energy transfer. Energy of the triplet excitons of the second host material D can be transferred to the triplet excitons of the second TADF sensitizer E through Dexter energy transfer. The triplet exciton of the second TADF sensitizer E may jump to its own singlet state through reverse intersystem crossing. Therefore, the Dexter energy transfer from the triplet excitons of the second TADF sensitizer E to triplet excitons of the second fluorescent emissive material F may be suppressed, which improves the luminous efficiency. In addition, S1(D) is greater than S1(E) and S1(E) is greater than S1(F), and T1(D) is greater than T1(E) and T1(E) is greater than T1(F) (i.e., $S1(D)>S1(E)>S1(F)$, $T1(D)>T1(E)>T1(F)$). Therefore, it may be possible to effectively prevent energy from being transferred inversely from the second fluorescent emissive material F to the second TADF sensitizer E and the second host material D, which achieves sufficient host-guest energy transfer.

In some embodiments, wavelengths corresponding to peaks of the emission peaks with the highest energy of the second host material D, the second TADF sensitizer E, and the second fluorescent emissive material F meet:

$\lambda(D)>\lambda(E)>\lambda(F)$.

In the embodiments, it may ensure that energy transfers from a high-energy state to a low-energy state, which prevents reverse transfer of energy, thereby achieving full utilization of energy.

In some embodiments, the HOMO energy level of the second host material D and the HOMO energy level of the second TADF sensitizer E, and the LUMO energy level of the second host material D and the LUMO energy level of the second TADF sensitizer E meet:

$|HOMO|(D)-|HOMO|(E)<0.2$ eV;

$|LUMO|(D)-|LUMO|(E)>0.3$ eV;

and/or, the HOMO energy level of the first host material A and the HOMO energy level of the first TADF sensitizer B, and the LUMO energy level of the first host material A and the LUMO energy level of the first TADF sensitizer B meet:

$|HOMO|(A)-|HOMO|(B)<0.2$ eV; and $|LUMO|(B)-|LUMO|(A)>0.3$ eV.

In the embodiments, in the second light-emitting layer 133b, the HOMO energy level of the second host material D is not much different from the HOMO energy level of the second TADF sensitizer E, which is beneficial for the holes transitioning into the HOMO energy level of the second TADF sensitizer E. The LUMO energy level of the second TADF sensitizer E is deeper than the LUMO energy level of the second host material D, which is beneficial for the electrons falling into the LUMO energy level of the second TADF sensitizer E. As a result, the electrons and the holes mainly recombine on the second TADF sensitizer E and tend to form the excitons of the second TADF sensitizer E to emit light, so as to avoid forming electron-hole pairs between host light emitter and guest light emitter, which is not beneficial for light emission; and/or, in the first light-emitting layer 133a, the HOMO energy level of the first host material A is not much different from the HOMO energy level of the first TADF sensitizer B, which is beneficial for the holes transitioning into the HOMO energy level of the first TADF sensitizer B; the LUMO energy level of the first TADF sensitizer B is deeper than the LUMO energy level of the first host material A, which is beneficial for the electrons falling into the LUMO energy level of the first TADF sensitizer B. As a result, the electrons and the holes mainly recombine on the first TADF sensitizer B and tend to form the excitons of the first TADF sensitizer B to emit light, so as to avoid forming the electron-hole pairs between the host light emitter and the guest light emitter, which is not beneficial for light emission.

In some embodiments, the second host material D and the second TADF sensitizer E meet the following relations:

$||HOMO|(D)-|LUMO|(E)-S1(E)| \le 0.2$ eV; and $||HOMO|(D)-|LUMO|(E)-T1(E)| \le 0.2$ eV.

That is, the second host material D and the second TADF sensitizer E do not form exciplex.

And/or, the first host material A and the first TADF sensitizer B meet the following relations:

$||HOMO|(A)-|LUMO|(B)-S1(B)| \le 0.2$ eV; and $||HOMO|(A)-|LUMO|(B)-T1(B)| \le 0.2$ eV.

That is, the first host material A and the first TADF sensitizer B do not form exciplex.

The exciplex is an aggregate of two different kinds of molecules or atoms. The two molecules or atoms interact strongly and generate a new energy level in the excited state of the exciplex. An emission spectrum of the exciplex is different from that of a single species, and the exciplex has no fine structure.

In the embodiments, in a case where the second host material D and the second TADF sensitizer E do not form the exciplex, each of the second host material D and the second TADF sensitizer E does not generate a spectrum different from its intrinsic spectrum. In a case where the first host material A and the first TADF sensitizer B do not form the exciplex, each of the first host material A and the first TADF sensitizer B does not generate a spectrum different from its intrinsic spectrum. Therefore, it can avoid a problem of unreliable performance due to changes in luminescence properties of the second host material D and the second TADF sensitizer E, and/or, changes in the luminescent properties of the first host material A and the first TADF sensitizer B. Therefore, the color purity of the light emission can be further improved.

In order to further prevent the unreliable performance caused by the formation of the exciplex, and further improve the color purity of the light emission, optionally, the second host material D and the first TADF sensitizer B meet the following relations:

$||HOMO|(D)-|LUMO|(B)-S1(B)| \le 0.2$ eV; and $||HOMO|(D)-|LUMO|(B)-T1(B)| \le 0.2$ eV.

That is, the second host material D and the first TADF sensitizer B do not form exciplex.

And/or, the first host material A and the second TADF sensitizer E meet the following relations:

$||HOMO|(A)-|LUMO|(E)-S1(E)| \le 0.2$ eV; and $||HOMO|(A)-|LUMO|(E)-T1(E)| \le 0.2$ eV.

That is, the first host material A and the second TADF sensitizer E do not form exciplex.

For specific principles, reference may be made to the description that the second host material D and the second TADF sensitizer E do not form exciplex, and/or, the description that the first host material A and the first TADF sensitizer B do not form exciplex, which will not be repeated herein.

In some embodiments, the first host material A and the second host material are the same, and the first TADF sensitizer B and the second TADF sensitizer E are the same. A mass ratio of the first TADF sensitizer B to the first host material A is the same as a mass ratio of the second TADF sensitizer E to the second host material D.

In the embodiments, the first light-emitting layer 133a is provided, and by using the singlet excitons and the triplet excitons generated at the first light-emitting layer 133a and the sufficient reverse intersystem crossing from the triplet excited state to the singlet excited state generated by the first TADF sensitizer B through thermal excitation, the triplet excitons are converted into the singlet excitons, and then the energy of the singlet excitons is transferred to the singlet excitons of the second fluorescent emissive material F through Forster energy transfer. As a result, sufficient energy transfer from the first light-emitting layer 133a to the second light-emitting layer 133b can be achieved only through the transition of the singlet excitons of the second fluorescent emissive material F back to the ground state to emit light, which improve the luminous efficiency and the fluorescence lifetime.

In some embodiments, the first host material A and the second host material D are the same, the first TADF sensitizer B and the second TADF sensitizer E are the same, and the mass ratio of the first TADF sensitizer B to the first host material A is less than the mass ratio of the second TADF sensitizer E to the second host material D.

In the embodiments, in a case where a doping concentration of the second TADF sensitizer E in the second host material D is constant, by reducing a doping concentration of the first TADF sensitizer B in the first host material A, an excited state density of a single molecule of the first TADF sensitizer B may be effectively increased, so that a probability of the reverse intersystem crossing is increased. The excitons generated at the first light-emitting layer 133a can be fully used to avoid a problem that the excitons at the first light-emitting layer 133a contributes little due to the unbalanced hole transport in the related art, and a problem that it is not beneficial for energy of the singlet excitons of the first TADF sensitizer B to transferring to the singlet excitons of the second fluorescent emissive material F through Forster energy transfer due to a low exciton utilization rate, which may make an energy utilization rate high.

In some embodiments, the mass ratio of the first TADF sensitizer B to the first host material A is greater than or equal to 5%, and is less than or equal to 40%. The mass ratio of the second TADF sensitizer E to the second host material D is greater than or equal to 15%, and is less than or equal to 50%.

For example, in a case where the mass ratio of the first TADF sensitizer B to the first host material A is equal to 5%, the mass ratio of the second TADF sensitizer E to the second host material D may be equal to 15%. In a case where the mass ratio of the first TADF sensitizer B to the first host material A is equal to 15%, the mass ratio of the second TADF sensitizer E to the second host material D may be equal to 25%.

For example, the first host material A and the second host material are both selected from TM, and TM is selected from 3,3'-Di(9H-carbazol-9-yl)biphenyl; the first TADF sensitizer B and the second TADF sensitizer E are selected from TH-1, and TH-1 is selected from 3,4,5,6-tetrakis(3,6-di-t-Butylcarbazol-9-yl)-1,2-dicyanobenzene. A comparative example 1 and an experimental example 1 are provided. In the comparative example 1, the mass ratio of the first host material A to the first TADF sensitizer B is equal to the mass ratio of the second host material D to the second TADF sensitizer E, which are both 70%:29.3%. That is, a material composition of the first light-emitting layer 133a and a material composition of the second light-emitting layer 133b in the comparative example are the same, i.e., the first light-emitting layer and the second light-emitting layer constitute a single-layered light-emitting layer. In this case, a mass percentage of Dopant in the light-emitting layer may be 0.7%. In the experimental example 1, the mass ratio of the first host material A to the first TADF sensitizer B is 80%:20%, and there is no Dopant in the first light-emitting layer 133a. After the light-emitting devices are fabricated, the same current density is introduced to the light-emitting devices, and the luminous efficiency, voltages, color coordinates, service lives and the like of the light-emitting devices are tested, and the obtained results are shown in the following Table 1, and FIGS. 6 and 7.

TABLE 1

| Light-emitting device | Current density (mA/cm2) | Voltage (V) | Efficiency (cd/A) | Color coordinates (CIE-1931) | LT95 service life |
| --- | --- | --- | --- | --- | --- |
| Comparative example 1 | 15 | 4.31 | 100% | 0.663, 0.337 | 100% |
| Experimental example 1 | 15 | 4.29 | 106% | 0.661, 0.339 | 115% |

Figure 6:
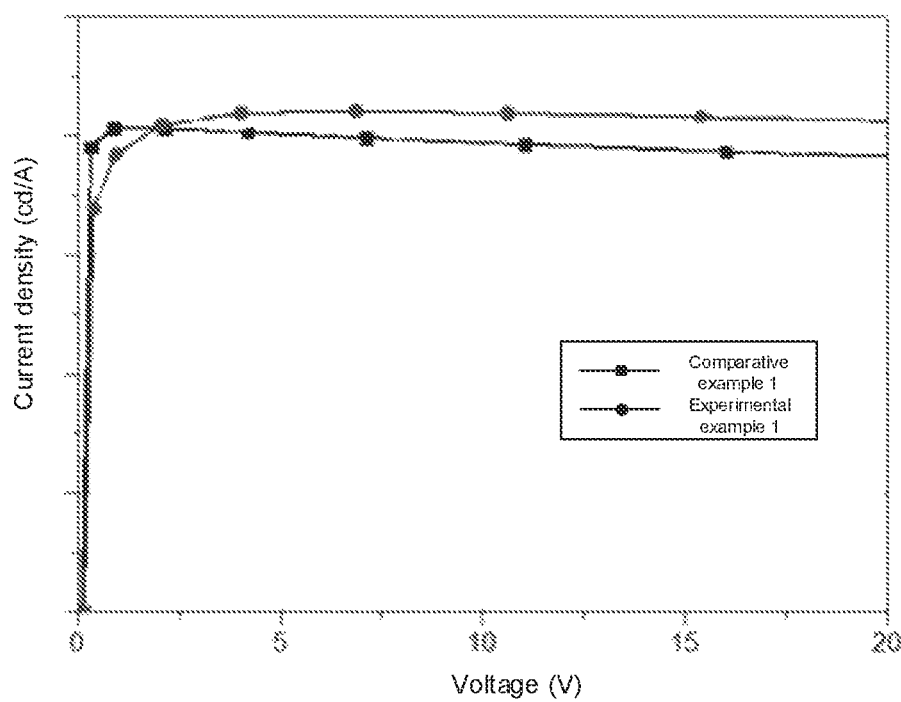
FIG. 6 is a comparison diagram of voltage-current characteristic curves of light-emitting devices of a comparative example 1 and an experimental example 1, in accordance with some embodiments.
Figure 7:
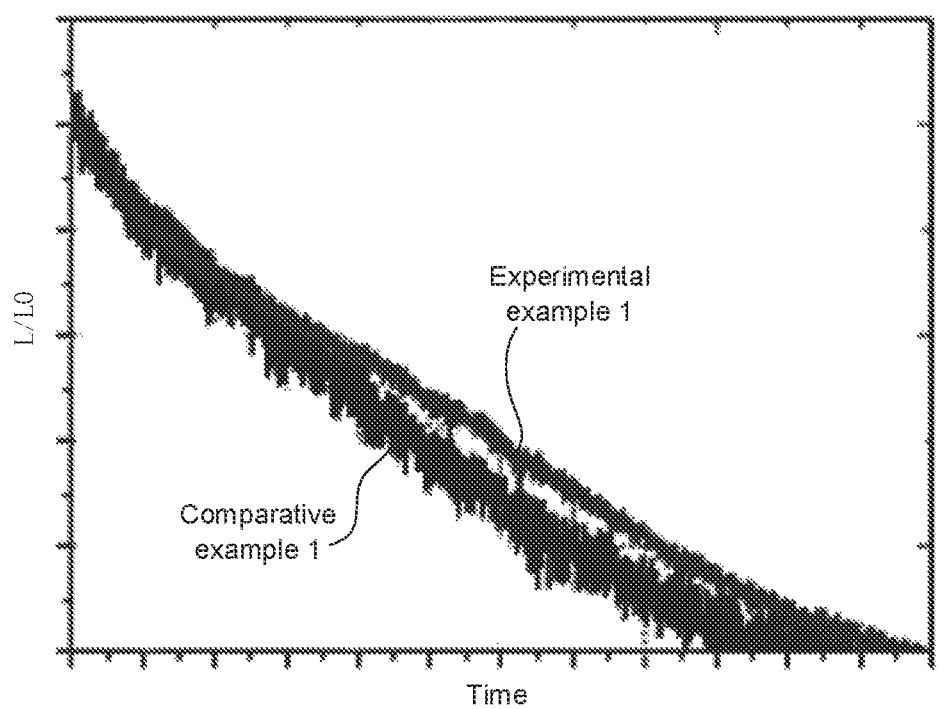
FIG. 7 is a comparison diagram of service lives of light-emitting devices of a comparative example 1 and an experimental example 1, in accordance with some embodiments.

It can be seen from Table 1, and FIGS. 6 and 7 that, by reducing a doping concentration of the first TADF sensitizer B in the first light-emitting layer 133a, it can promote a balanced carrier distribution and use the excitons efficiently, so that the device has high efficiency, low efficiency roll-off, and correspondingly, has a long service life.

In the ordinate of FIG. 7, L refers to the luminance of the device at a certain moment, L0 refers to an initial luminance of the device, and L/L0 refers to a decay rate of the luminance of the device over time.

In Table 1, the service life of the device in the comparative example 1 is 100%, and the service life of the device in the experimental example 1 is 115%, which means that by taking the service life of the device in the comparative example 1 as a comparison reference, the service life of the device in the experimental example 1 is 15% higher than the service life of the device in the comparative example 1.

In some embodiments, the first TADF sensitizer B and the second TADF sensitizer E are different, the lowest triplet energy of the first TADF sensitizer B and the lowest triplet energy of the second TADF sensitizer E, and the lowest singlet energy of the first TADF sensitizer B and the lowest singlet energy of the second TADF sensitizer E meet:

$|T1(E)-T1(B)|<0.2$ eV; and $|S1(E)-S1(B)|<0.2$ eV;

and/or, in a same test condition, luminous efficiency of a luminescence system composed of the first host material A and the first TADF sensitizer B is greater than that of a luminescence system composed of the second host material D and the second TADF sensitizer E.

In the luminescence system composed of the first host material A and the first TADF sensitizer B and the luminescence system composed of the second host material D and the second TADF sensitizer E, the mass ratio of the first TADF sensitizer B to the first host material A is the same as or different from the mass ratio of the second TADF sensitizer E to the second host material D.

The same test condition refer to a condition where the luminescence system composed of the first host material A and the first TADF sensitizer B and the luminescence system composed of the second host material D and the second TADF sensitizer E are each separately served as a light-emitting layer, and then the light-emitting layer is assembled with the same hole transport layer 134, electron transport layer 135, first electrode 131 and second electrode 132 to form the light-emitting device 13, and the light-emitting device 13 is tested with the same current.

In these embodiments, in the case where the first TADF sensitizer B and the second TADF sensitizer E are different, the lowest triplet energy of the first TADF sensitizer B and the lowest triplet energy of the second TADF sensitizer E, and the lowest singlet energy of the first TADF sensitizer B and the lowest singlet energy of the second TADF sensitizer E meet the above relational expressions, which can achieve the energy transfer between the first TADF sensitizer B and the second TADF sensitizer E to avoid energy loss. In addition, in the same test condition, in a case where the luminous efficiency of the luminescence system composed of the first host material A and the first TADF sensitizer B is greater than that of the luminescence system composed of the second host material D and the second TADF sensitizer E, it can also solve the problem that energy of the singlet excitons of the first TADF sensitizer B is difficult to be transferred to the singlet excitons of the second fluorescent emissive material F through Forster energy transfer due to the small contribution of the excitons at the first light-emitting layer caused by the unbalanced hole transport in the related art.

In some embodiments, the first light-emitting layer 133a further includes a first fluorescent emissive material C. The lowest singlet energy S1 of the first host material A, the lowest singlet energy S1 of the first TADF sensitizer B, the lowest singlet energy S1 of the first fluorescent emissive material C, the lowest triplet energy T1 of the first host material A, the lowest triplet energy T1 of the first TADF sensitizer B, and the lowest triplet energy T1 of the first fluorescent emissive material C meet:

$S1(A)-T1(A)>0.2$ eV;

$S1(B)-T1(B)<0.2$ eV;

$S1(C)-T1(C)>0.2$ eV;

$S1(A)>S1(B)>S1(C)$; and $T1(A)>T1(B)>T1(C)$.

That is, the first host material A, the first TADF sensitizer B and the first fluorescent emissive material C have the same energy transfer processes as the second host material D, the second TADF sensitizer E, and the second fluorescent emissive material F, which will not be repeated herein. Details may be referred to the above descriptions of the energy transfer processes of the second host material D the second TADF sensitizer E, and the second fluorescent emissive material F.

The first fluorescent emissive material C and the second fluorescent emissive material F are the same or different. That is, according to the fact that the first fluorescent emissive material C and the second fluorescent emissive material F are both monomer materials, molecular structures of the first fluorescent emissive material C and the second fluorescent emissive material F are the same or different.

In a case where the first fluorescent emissive material C and the second fluorescent emissive material F are different, a wavelength corresponding to an emission peak in a normalized electroluminescence spectrum of the first fluorescent emissive material C is less than the wavelength corresponding to the emission peak in the normalized electroluminescence spectrum of the second fluorescent emissive material F, and there is a third overlapping region between the normalized electroluminescence spectrum of the first fluorescent emissive material C and the normalized absorption spectrum of the second fluorescent emissive material F. The first fluorescent emissive material C and the second fluorescent emissive material F meet the above spectral features, so that energy of singlet excitons of the first fluorescent emissive material C can be transferred to the singlet excitons of the second fluorescent emissive material F through Forster energy transfer, thereby further improving the luminous efficiency of the second fluorescent emissive material F.

In some embodiments, an area of the third overlapping region is greater than 70% of the area of the normalized absorption spectrum of the second fluorescent emissive material F, and/or, a difference between the peak wavelength of the absorption peak with the lowest energy in the normalized absorption spectrum of the second fluorescent emissive material F and a peak wavelength of the emission peak with the highest energy in the normalized electroluminescence spectrum of the first fluorescent emissive material C is less than or equal to 25 nm. Energy of the singlet excitons of the first fluorescent emissive material C can be more fully transferred to the singlet excitons of the second fluorescent emissive material F through Forster energy transfer, thereby further improving the luminous efficiency of the second fluorescent emissive material F, and improving the color purity.

On this basis, in some embodiments, there is a fourth overlapping region between the normalized electroluminescence spectrum of the first fluorescent emissive material C and the normalized electroluminescence spectrum of the second fluorescent emissive material F. Energy transfer from the first fluorescent emissive material C to the second fluorescent emissive material F can be sufficient, and the luminous efficiency of the second fluorescent emissive material F can be further improved.

In some embodiments, an area of the fourth overlapping region is greater than 90% of each of areas of the normalized electroluminescence spectra of the first fluorescent emissive material C and the second fluorescent emissive material F, and/or, an absolute value of a difference between the peak wavelength of the emission peak of the normalized electroluminescence spectrum of the first fluorescent emissive material C and the peak wavelength of the emission peak of the normalized electroluminescence spectrum of the second fluorescent emissive material F is less than 5 nm.

In some embodiments, wavelengths corresponding to peaks of the emission peaks with the highest energy of the first host material A, the first TADF sensitizer B, and the first fluorescent emissive material C meet:

$\lambda(A)>\lambda(B)>\lambda(C)$.

In the embodiments, it may ensure that energy transfers from a high-energy state to a low-energy state, which prevents reverse transfer of energy, thereby achieving full utilization of energy.

In some embodiments, in a case where the first fluorescent emissive material C and the second fluorescent emissive material F are the same, the first TADF sensitizer B and the second TADF sensitizer E are the same, and the first host material A and the second host material D are the same, a mass percentage of the first fluorescent emissive material C in the first light-emitting layer 133a is greater than a mass percentage of the second fluorescent emissive material F in the second light-emitting layer 133b.

That is, there is a situation that only the mass percentage of the first fluorescent emissive material C in the first light-emitting layer 133a and the mass percentage of the second fluorescent emissive material F in the second light-emitting layer 133b are different in the first light-emitting layer 133a and the second light-emitting layer 133b.

In some embodiments, a difference between the mass percentage of the first fluorescent emissive material C in the first light-emitting layer 133a and the mass percentage of the second fluorescent emissive material F in the second light-emitting layer 133b is at least greater than or equal to 0.1%.

In some embodiments, the mass percentage of the first fluorescent emissive material C in the first light-emitting layer 133a is within a range of 0.5% to 3%, inclusive, and the mass percentage of the second fluorescent emissive material F in the second light-emitting layer 133b is within a range of 0.5% to 3%, inclusive.

Here, for example, the first host material A and the second host material are both selected from TM, and TM is selected from 3,3'-Di(9H-carbazol-9-yl)biphenyl; the first TADF sensitizer B and the second TADF sensitizer E are both selected from TH-1, and TH-1 is selected from 3,4,5,6-tetrakis(3,6-di-t-Butylcarbazol-9-yl)-1,2-dicyanobenzene; the first fluorescent emissive material C and the second fluorescent emissive material F are both selected from Dopant, and Dopant is selected from Difluoro{3-ethyl-5-[1-(4-ethyl-3,5-dimethyl-2H-pyrrol-2-ylidene-N)ethyl]-2,4-dimethyl-1H-pyrrolato-N}boron. A comparative example 2 and an experimental example 2 are provided. In the comparative example 2, the mass ratio of the first host material A to the first TADF sensitizer B is equal to the mass ratio of the second host material D to the second TADF sensitizer E, which are both 70%:29.3%, and a mass percentage of the first fluorescent emissive material C in the first light-emitting layer and a mass percentage of the second fluorescent emissive material F in the second light-emitting layer are the same, which are both 0.7%. That is, the material composition of the first light-emitting layer 133a and the material composition of the second light-emitting layer 133b are the same. That is, the first light-emitting layer and the second light-emitting layer constitute a single-layered light-emitting layer. In the experimental example 2, the mass ratio (19%:80%) of the first TADF sensitizer B to the first host material A is less than the mass ratio (29.3%:70%) of the second TADF sensitizer E to the second host material D, and the mass percentage (1%) of the first fluorescent emissive material C in the first light-emitting layer is greater than the mass percentage (0.7%) of the second fluorescent emissive material F in the second light-emitting layer 133b. After top-emission light-emitting devices are fabricated, the same current density is introduced to the light-emitting devices, and the voltages, luminous efficiency, color coordinates, service lives and the like of the light-emitting devices are tested, and the obtained results are shown in the following Table 2, and FIGS. 8 and 9.

TABLE 2

| Device ID | Current density (mA/cm2) | Voltage (V) | Efficiency (cd/A) | Color coordinates (CIE-1931) | LT95 service life |
|---|---|---|---|---|---|
| Comparative example 2 | 15 | 4.31 | 100% | 0.667, 0.333 | 100% |
| Experimental example 2 | 15 | 4.22 | 112% | 0.667, 0.334 | 130% |

Figure 8:
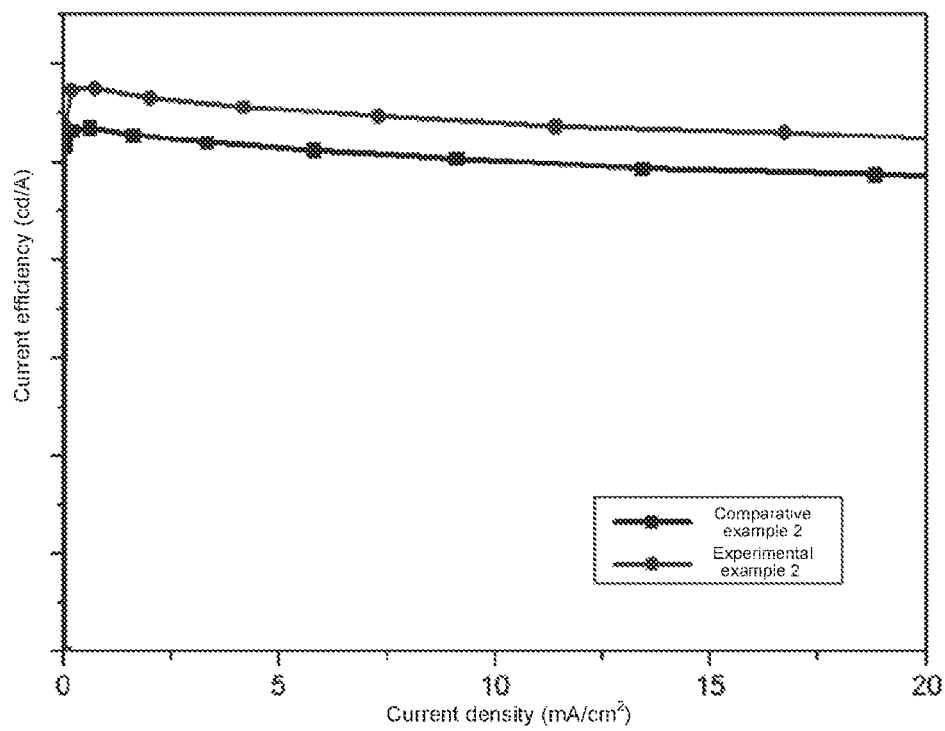
FIG. 8 is a comparison diagram of voltage-current characteristic curves of light-emitting devices of a comparative example 2 and an experimental example 2, in accordance with some embodiments.
Figure 9:
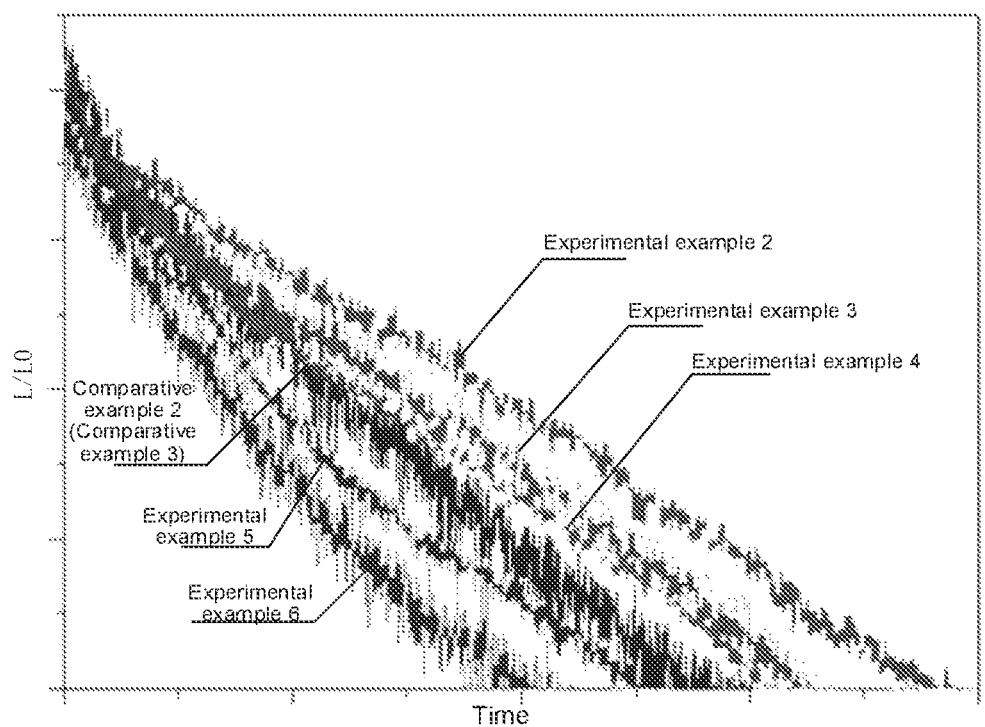
FIG. 9 is a comparison diagram of service lives of light-emitting devices of a comparative example 2, an experimental example 2, a comparative example 3 and experimental examples 3 to 6, in accordance with some embodiments.

It can be seen from Table 2, and FIGS. 8 and 9 that, by reducing the doping concentration of the first TADF sensitizer B in the first light-emitting layer 133a and increasing a doping concentration of Dopant in the first light-emitting layer 133a, the light-emitting device has high efficiency, a low voltage and long service life.

In the ordinate of FIG. 9, L refers to the luminance of the device at a certain moment, L0 refers to an initial luminance of the device, and L/L0 refers to a decay degree of the luminance of the device over time.

In Table 2, the service life of the device in the comparative example 2 is 100%, and the service life of the device in the experimental example 2 is 130%, which means that by taking the service life of the device in the comparative example 2 as a comparison reference, the service life of the device in the experimental example 2 is 30% higher than the service life of the device in the comparative example 2.

In some embodiments, the thickness of the first light-emitting layer 133a is less than the thickness of the second light-emitting layer 133b.

That is, in a case where a total thickness of the first light-emitting layer 133a and the second light-emitting layer 133b is considered to be the same as a thickness of the entire light-emitting layer, there is no balance between transports of the holes and the electrons, and the recombination position is proximate to the electron transport layer 135. If the thickness of the first light-emitting layer 133a is less than the thickness of the second light-emitting layer 133b, energy of the excitons at the position where the exciton contribution is small may be transferred to the second light-emitting layer 133b, so as to prevent a problem that the holes and electrons that should be originally recombined in the second light-emitting layer 133b are recombined in the first light-emitting layer 133a to generate excitons due to an excessive large thickness of the first light-emitting layer 133a, which causes that the excitons that should be radiated to emit light are changed into excitons for energy transfer, causing the luminous efficiency to be reduced.

The second host material D, the second TADF sensitizer E and the second fluorescent emissive material F are served as constituent materials of the light-emitting layer. The second fluorescent emissive material F is doped into the second host material D and the second TADF sensitizer E, and may at different positions in the light-emitting layer. By testing the luminous intensity of the second fluorescent emissive material F at different positions in the light-emitting layer, a graph showing a relation between a distance between the second fluorescent emissive material F and a surface of the light-emitting layer proximate to the hole transport layer and the luminous intensity of the second fluorescent emissive material F may be obtained as shown in FIG. 10.

The second host material D is selected from TM, and TM is selected from 3,3'-Di(9H-carbazol-9-yl)biphenyl. The second TADF sensitizer E is selected from TH-1, and TH-1 is selected from 3,4,5,6-tetrakis(3,6-di-t-Butylcarbazol-9-yl)-1,2-dicyanobenzene. The second fluorescent emissive material F is selected from Dopant, and Dopant is selected from Difluoro{3-ethyl-5-[1-(4-ethyl-3,5-dimethyl-2H-pyrrol-2-ylidene-N)ethyl]-2,4-dimethyl-1H-pyrrolato-N}boron.

Figure 10:
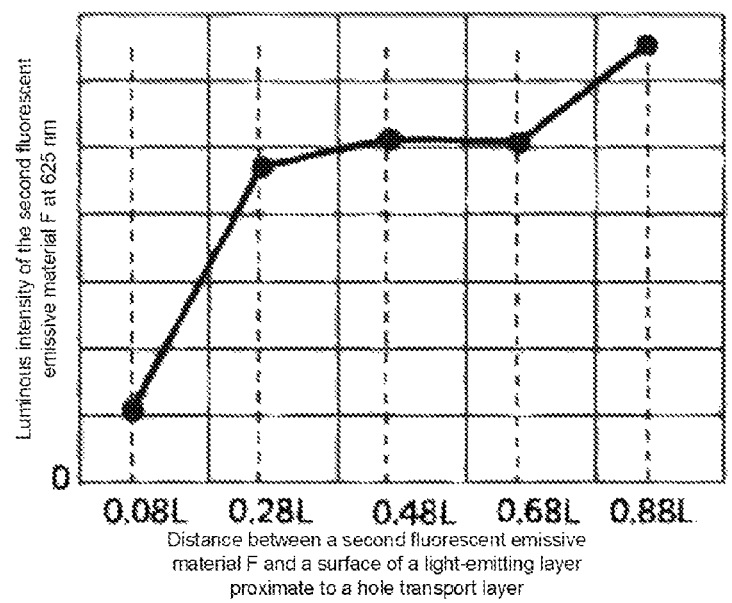
FIG. 10 is a graph showing a relationship between a distance between a second fluorescent emissive material F and a surface of a light-emitting layer proximate to a hole transport layer and a luminous intensity of the second fluorescent emissive material F at 625 nm, in accordance with some embodiments.

It can be seen from FIG. 10 that, in a case where the thickness of the light-emitting layer is L nm, as a doping position of the second fluorescent emissive material F in the light-emitting layer changes from a surface of the light-emitting layer proximate to the hole transport layer to a surface thereof away from the hole transport layer, the luminous intensity of the electroluminescence spectrum of the second fluorescent emissive material F changes regularly. In a case where a distance between the second fluorescent emissive material F and the surface of the light-emitting layer proximate to the hole transport layer is within a thickness range of 0 nm to ⅓L nm, the luminous intensity of the electroluminescence spectrum of the second fluorescent emissive material F gradually increases. In a case where the distance between the second fluorescent emissive material F and the surface of the light-emitting layer proximate to the hole transport layer is within a thickness range of ⅓L nm to ⅔L nm, the luminous intensity of the electroluminescence spectrum of the second fluorescence luminescent material F is basically stable. In a case where the distance between the second fluorescent emissive material F and the surface of the light-emitting layer proximate to the hole transport layer is within a thickness range of ⅔L nm to L nm, the luminous intensity of the electroluminescence spectrum of the second fluorescence luminescent material F continues to increase. It can be shown that, at a position proximate to the electron transport layer 134, i.e., in a region that occupies about ⅓ of the entire light-emitting region, there are a small amount of excitons, and the contribution to the light emission of the device is small.

On this basis, different material compositions in different light-emitting regions are provided, that is, the light-emitting layer in the prior art is transformed into a first light-emitting layer 133a and a second light-emitting layer 133b that are with different material compositions, the material composition of the second light-emitting layer 133b follows the material composition of the light-emitting layer in the prior art, and the material composition of the first light-emitting layer 133a is different from the material composition of the second light-emitting layer 133b. According to the structural features of the exciton distribution in the light-emitting device, a ratio of the thickness of the first light-emitting layer 133a to the thickness of the second light-emitting layer 133b is adjusted. In a same current density, the voltage, luminous efficiency, color coordinates, service life and the like of each light-emitting device with a different ratio of the thickness of the first light-emitting layer 133a to the thickness of the second light-emitting layer 133b are tested and evaluated. The results are shown in the following Table 3, and FIGS. 8 and 9.

In the above test, for example, the first host material A and the second host material D are the same, and are selected from TM, and TM is selected from 3,3'-Di(9H-carbazol-9-yl)biphenyl; the second TADF sensitizer E is selected from TH-1; the first TADF sensitizer B is different from the second TADF sensitizer E and is selected from TH-2, and TH-2 is selected from 2,3,5,6-tetrakis(carbazol-9-yl)-1,4-dicyanobenzene. There is no first fluorescent emissive material C in the first light-emitting layer 133a, and the second fluorescent emissive material F is selected from Dopant, and Dopant is selected from Difluoro{3-ethyl-5-[1-(4-ethyl-3,5-dimethyl-2H-pyrrol-2-ylidene-N)ethyl]-2,4-dimethyl-1H-pyrrolato-N}boron. A comparative example 3 and experimental examples 3 to 6 are provided. In the comparative example 3, the material composition of the first light-emitting layer 133a and the material composition of the second light-emitting layer 133b are the same. That is, the first light-emitting layer and the second light-emitting layer constitute a single-layered light-emitting layer. In the experimental examples 4 to 6, the material compositions of the first light-emitting layers 133a and the material compositions of the second light-emitting layers 133b are the same, but the ratios of the thicknesses of the first light-emitting layers 133a to the thicknesses of the second light-emitting layers 133b are different. For example, in the first light-emitting layers 133a, the mass ratios of the first TADF sensitizers B to the first host materials A are all 19%:80%, and the mass percentages of the first fluorescent emissive materials C in the first light-emitting layers are all 0.7%. In the second light-emitting layers 133b, the mass ratios of the second TADF sensitizers E to the second host materials D are all 40%:60%, and the mass percentages of the second fluorescent emissive materials F in the second light-emitting layers 133b are all 0.7%. The ratios of the thicknesses of the first light-emitting layers 133a to the thicknesses of the second light-emitting layers 133b are 3:22, 6:19, 9:16, and 12:13. That is, for example, a sum of the thickness of the first light-emitting layer 133a and the thickness of the second light-emitting layer 133b is 25 nm. In a case where the ratio of the thickness of the first light-emitting layer 133a to the thickness of the second light-emitting layer 133b is 3:22, the thickness of the first light-emitting layer 133a is 3 nm, and the thickness of the second light-emitting layer 133b is 22 nm. In a case where the ratio of the thickness of the first light-emitting layer 133a to the thickness of the second light-emitting layer 133b is 6:19, the thickness of the first light-emitting layer 133a is 6 nm, and the thickness of the second light-emitting layer 133b is 19 nm. In a case where the ratio of the thickness of the first light-emitting layer 133a to the thickness of the second light-emitting layer 133b is 9:16, the thickness of the first light-emitting layer 133a is 9 nm, and the thickness of the second light-emitting layer 133b is 16 nm. In a case where the ratio of the thickness of the first light-emitting layer 133a to the thickness of the second light-emitting layer 133b is 12:13, the thickness of the first light-emitting layer 133a is 12 nm, and the thickness of the second light-emitting layer 133b is 13 nm.

TABLE 3

| Device | Current density (mA/cm2) | Voltage (V) | Efficiency (cd/A) | Color coordinates (CIE-1931) | LT95 service life |
|---|---|---|---|---|---|
| Comparative example 3 | 15 | 4.31 | 100% | 0.667, 0.333 | 100% |
| Experimental example 3 | 15 | 4.27 | 109% | 0.666, 0.333 | 110% |
| Experimental example 4 | 15 | 4.24 | 112% | 0.666, 0.334 | 105% |
| Experimental example 5 | 15 | 4.25 | 110% | 0.667, 0.333 | 86% |
| Experimental example 6 | 15 | 4.23 | 109% | 0.666, 0.334 | 68% |

Figure 11:
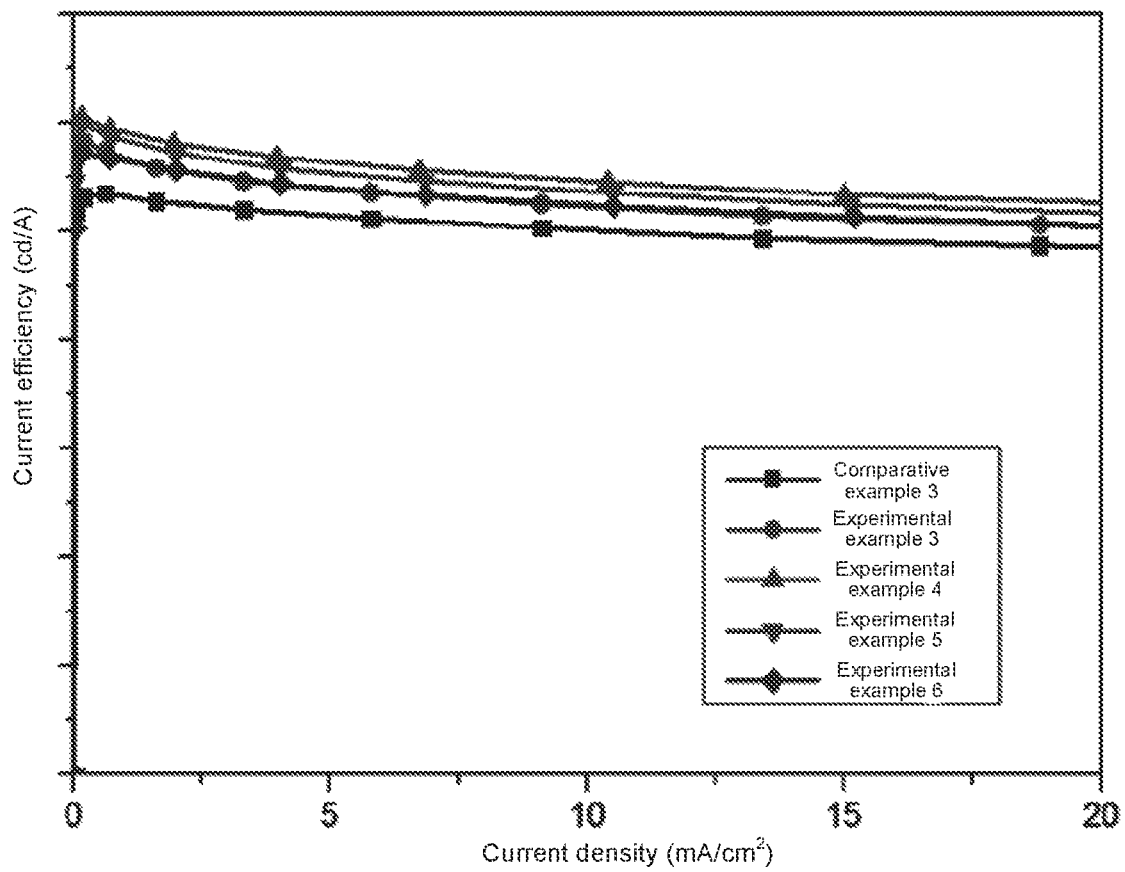
FIG. 11 is a comparison diagram of current density-current efficiency of light-emitting devices of a comparative example 3 and experimental examples 3 to 6, in accordance with some embodiments.

It can be seen from Table 3, and FIGS. 11 and 9 that, compared with the comparative example 3, in each of the experimental examples 3 to 6, the first TADF sensitizer B is different from the second TADF sensitizer E, and the emission peak of the first TADF sensitizer B has a larger overlapping areas with the absorption peak of Dopant, which makes the experimental examples 3 to 6 have high efficiency and a low voltage. As the ratio of the thickness of the first light-emitting layer 133a to the thickness of the second light-emitting layer 133b gradually increases, the service life of the device tends to decrease. The service lives in the experimental examples 3 and 4 are higher than that in the comparative example 3, and the service lives in the experimental examples 5 and 6 are lower than that in the comparative example 3.

In Table 3, the service life of the device in the comparative example 3 is 100%, and the service life of the device in the experimental example 3 is 110%, which means that by taking the service life of the device in the comparative example 3 as a comparison reference, the service life of the device in the experimental example 3 is 10% higher than the service life of the device in the comparative example 3. The service life of the device in the experimental example 4 is 105%, which means that by taking the service life of the device in the comparative example 3 as the comparison reference, the service life of the device in the experimental example 4 is 5% higher than the service life of the device in the comparative example 3. The service life of the device in the experimental example 5 is 86%, which means that by taking the service life of the device in the comparative example 3 as the comparison reference, the service life of the device in the experimental example 5 is 14% lower than the service life of the device in the comparative example 3. The service life of the device in the experimental example 6 is 68%, which means that by taking the service life of the device in the comparative example 3 as the comparison reference, the service life of the device in the experimental example 6 is 32% lower than the service life of the device in the comparative example 3.

In the experimental examples and comparative examples, the energy levels and excited state energy information of the used materials are shown in Table 4 below.

TABLE 4

|  | HOMO | LUMO | T1 | S1 |
|---|---|---|---|---|
| TM | 5.8 | 2.6 | 2.70 | 3.48 |
| TH-1 | 5.8 | 3.5 | 2.35 | 2.42 |
| TH-2 | 5.9 | 3.6 | 2.32 | 2.40 |
| TH-3 | 5.8 | 3.1 | 2.44 | 2.49 |
| Dopant | 5.6 | 3.6 | N.D. | 2.03 |
| EBL | 5.7 | / | 2.61 | / |
| HBL | 6.4 | / | 2.59 | / |

Figure 12:
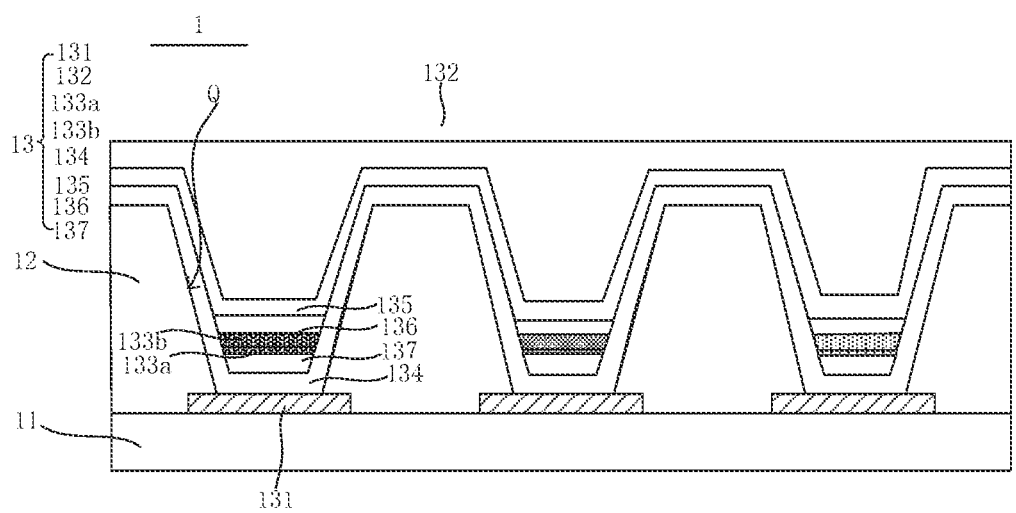
FIG. 12 is a sectional structural view of a light-emitting substrate, in accordance with some other embodiments.

In some embodiments, as shown in FIG. 12, the light-emitting device 13 further includes an electron blocking layer (EBL) 136 located between the hole transport layer 134 and the first light-emitting layer 133a, and/or, a hole blocking layer (HBL) 137 located between the electron transport layer 135 and the second light-emitting layer 133b.

In some embodiments, in a case where the light-emitting device 13 includes the electron blocking layer 136, the lowest triplet energy of the electron blocking layer 136 is greater than the lowest triplet energy of the first TADF sensitizer B in the first light-emitting layer 133a, and a difference between the two is greater than 0.2 eV. In a case where the light-emitting device 13 includes the hole blocking layer 137, the lowest triplet energy of the hole blocking layer 137 is greater than the lowest triplet energy of the second TADF sensitizer E in the second light-emitting layer 133b, and a difference between the two is greater than 0.2 eV. The electron blocking layer 136 and/or the hole blocking layer 137 have a good triplet exciton blocking capability, and can confine the triplet excitons in the light-emitting layer.

In some embodiments, in the case where the light-emitting device 13 includes the hole blocking layer 137, an absolute value of the HOMO energy level of the hole blocking layer 137 is higher than an absolute value of the HOMO energy level of the second host material D by 0.2 eV. In the case where the light-emitting device 1 includes the electron blocking layer 136, an energy level difference between the HOMO energy level of the electron blocking layer 136 and the HOMO energy level of the first host material A is less than or equal to 0.2 eV.

In the embodiments, the hole blocking layer 137 has a good hole blocking capability, and the electron blocking layer 136 will not affect hole transport. In the light-emitting devices, the hole mobility is at least one order of magnitude higher than the electron mobility.

Figure 13:
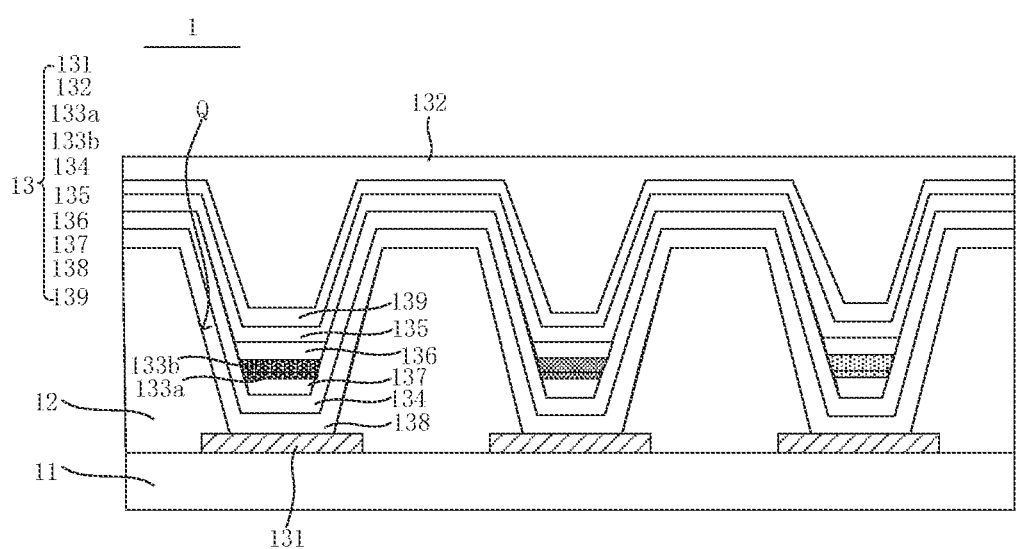
FIG. 13 is a sectional structural view of a light-emitting substrate, in accordance with yet some other embodiments.

It will be noted that, for a light-emitting substrate including light-emitting devices of a same light-emitting color, the electron transport layer 135, the hole transport layer 134, the electron blocking layer 136, and the hole blocking layer 137 described above may all be whole layers. For a light-emitting substrate including light-emitting devices of different light-emitting colors, the hole blocking layers 137 of the light-emitting devices of different light-emitting colors are different, and may be disposed in different openings. As shown in FIG. 13, only an example is shown, in which the light-emitting substrate includes light-emitting devices of three different colors.

In the embodiments, the electron transport layer 136 may be selected from organic materials with good electron transport properties, or organic materials doped with $LiQ_3$, Li, Ca, etc., and a thickness of the electron transport layer 136 may be within a range of 10 nm to 70 nm, inclusive. The hole transport layer may be selected from any one of N,N'-Bis-(1-naphthalenyl)-N,N'-bis-phenyl-(1,1'-biphenyl)-4,4'-diamine (also called N,N'-Bis(naphthalen-1-yl)-N,N'-bis(phenyl)benzidine, N,N'-Di(1-naphthyl)-N,N'-diphenyl-(1,1'-biphenyl)-4,4'-diamine) and 4,4'-cyclohexylidenebis[N,N-bis(p-tolyl)aniline]. A material of the electron blocking layer may be selected from any one of 4,4'-cyclohexylidenebis[N,N-bis(p-tolyl)aniline] and 4,4',4"-Tris(carbazol-9-yl)triphenylamine.

A material of the hole blocking layer (HBL) may be selected from 2,9-dimethyl-4,7-diphenyl-1,10-Phenanthroline.

In some other embodiments, as shown in FIG. 13, the light-emitting device 13 may further include a hole injection layer 138 and an electron injection layer (EIL) 139. A material of the electron injection layer may be selected from metals with a low work function, such as Li, Ca, Yb, or metal salts, such as LiF, $LiQ_3$, and a thickness of the electron injection layer may be within a range of 0.5 nm to 2 nm, inclusive. A material of the hole injection layer may be selected from copper(II) phthalocyanine (CuPc), hexaaza-triphenylenehexacabonitrile (HATCN), $MnO_3$, etc., or materials obtained after these materials undergo the P-type doping, and a thickness of the hole injection layer may be within a range of 5 nm to 30 nm, inclusive.

In embodiments of the present disclosure, a method for manufacturing the light-emitting device 13 is provided, and the method includes the following steps.

A first electrode 131, a hole transport layer 134, a first light-emitting layer 133a, a second light-emitting layer 133b, an electron transport layer 135, and a second electrode 132 that are sequentially stacked are formed.

A material of the first light-emitting layer 133a includes a first host material A and a first TADF sensitizer B, and a material of the second light-emitting layer 133b includes a second host material D, a second TADF sensitizer E, and a second fluorescent emissive material F.

Transmission rates of the material of the first light-emitting layer 133a and the material of the second light-emitting layer 133b to holes are both greater than transmission rates of the material of the first light-emitting layer 133a and the material of the second light-emitting layer 133b to electrons, and there is a first overlapping region between a normalized electroluminescence spectrum of the first TADF sensitizer B and a normalized absorption spectrum of the second fluorescent emissive material F.

The method for manufacturing the light-emitting device provided in the embodiments of the present disclosure has the same technical effects as the light-emitting devices described above, which will not be repeated herein.

In embodiments of the present disclosure, a method for manufacturing a light-emitting substrate is provided, and the method includes:

forming a plurality of light-emitting devices 13 on the base 11. Each light-emitting device 13 is the light-emitting device as described above.

Figure 14:
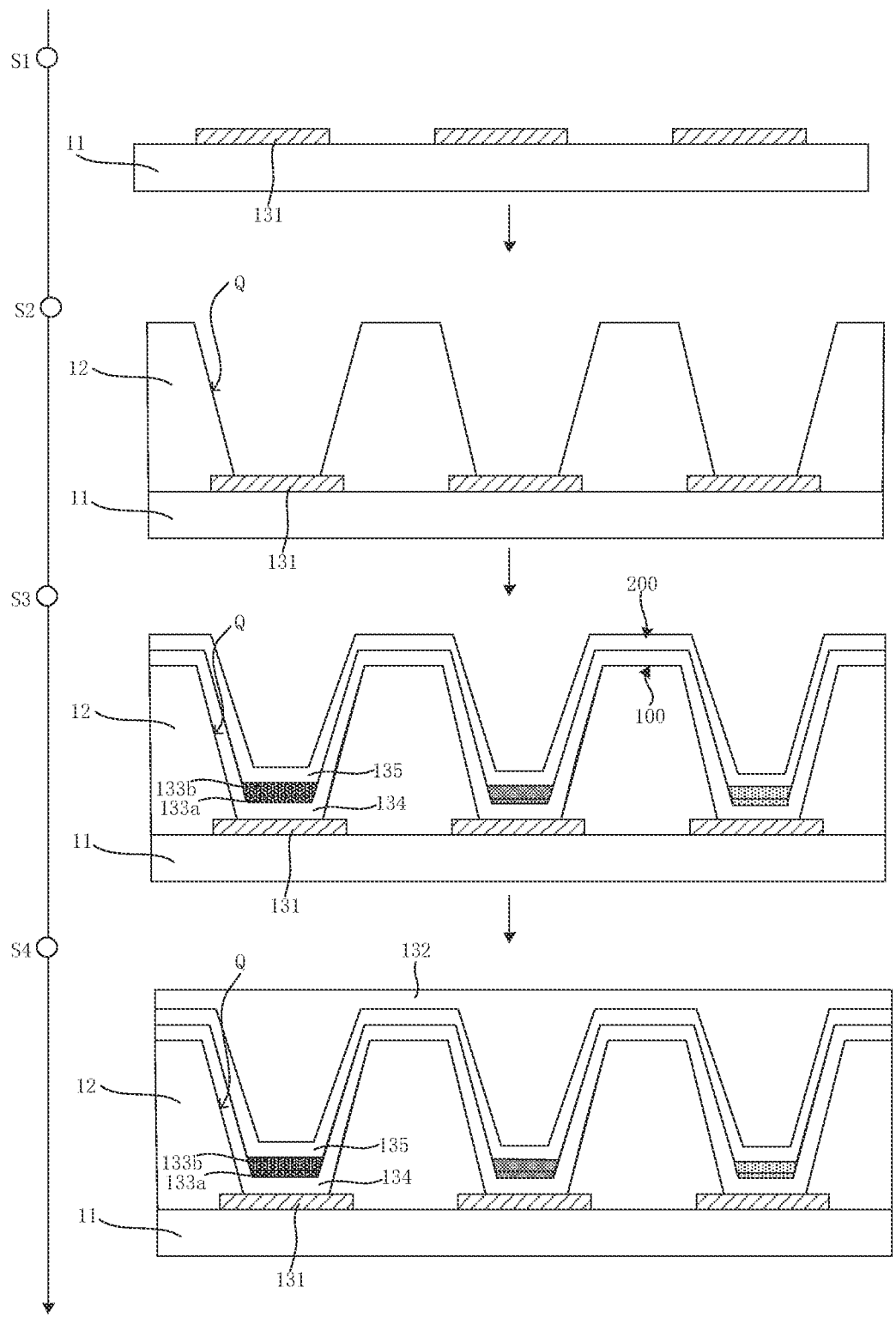
FIG. 14 is a diagram showing a process of a method for manufacturing a light-emitting substrate, in accordance with some embodiments.

Forming the plurality of light-emitting devices 13 on the base 11, as shown in FIG. 14, includes following steps.

In S1, a plurality of first electrodes 131 are formed on the base 11.

A material of the first electrode may be a material with a high work function. In this case, the plurality of first electrodes may be formed by depositing a conductive layer and performing exposure, photolithography, and etching processes on the conductive layer.

In S2, a pixel define layer 12 is formed on the base 11 on which the plurality of first electrodes 131 have been formed. The pixel define layer 12 defines a plurality of openings Q, and each opening Q exposes one first electrode 131.

In S3, a hole transport film 100, first light-emitting layers 133a, second light-emitting layers 133b, and an electron transport film 200 that are sequentially arranged are formed on the base 11 on which the pixel define layer 12 has been formed.

In S4, a second electrode 132 is formed on the base on which the hole transport film 100, the first light-emitting layers 133a, the second light-emitting layers 133b, and the electron transport film 200 have been formed.

A first light-emitting layer 133a and a second light-emitting layer 133b are both provided in each opening Q. Each of the hole transport film 100 and the electron transport film 200 includes a portion located at a corresponding position in each opening Q. The portion of the hole transport film 100 at the corresponding position in each opening constitutes a hole transport layer 134. The portion of the electron transport film 200 at the corresponding position in each opening Q constitutes an electron transport layer 135.

The first light-emitting layer 133a and the second light-emitting layer 133b may be formed through evaporation with a fine metal mask. The hole transport film 100 and the electron transport film 200 may be whole layers of films. In this case, the hole transport film 100 and the electron transport film 200 may be formed through evaporation.

Here, it will be noted that, in a case where the first light-emitting layer 133a includes the first host material A, the first TADF sensitizer B, and the first fluorescent emissive material C, the first host material A, the first TADF sensitizer B, and the first fluorescent emissive material C may be formed through multi-source evaporation. Similarly, the second host material D, the second fluorescent emissive material F, and the second TADF sensitizer E included in the second light-emitting layer 133b may also be formed through multi-source evaporation.

In some embodiments, in a case where the light-emitting device 13 further includes the hole blocking layer 137 and the electron blocking layer 136, the method for manufacturing the light-emitting substrate further includes the following steps.

The electron blocking layer 136 is formed before the first light-emitting layers 133a are formed, and the hole blocking layer 137 is formed before the electron transport layers 135 are formed. The hole blocking layer 137 and the electron blocking layer 136 may also be whole layers and formed through evaporation.

In some embodiments, the method for manufacturing the light-emitting substrate 1 further includes forming an encapsulation layer 15 on the base 11 on which the second electrode 132 has been formed.

In some embodiments, in the case where the light-emitting substrate 1 is a top-emission light-emitting substrate, the method for manufacturing the light-emitting substrate 1 further includes forming an optical capping layer 14 before the encapsulation layer 15 is formed, or after the encapsulation layer 15 is formed. A refractive index of the optical capping layer 14 is greater than 1.8, and the thickness thereof is within a range of 50 nm to 100 nm, inclusive.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A light-emitting device, comprising:
a first light-emitting layer and a second light-emitting layer that are stacked, a material of the first light-emitting layer including a first host material and a first thermally activated delayed fluorescence (TADF) sensitizer, and a material of the second light-emitting layer including a second host material, a second TADF sensitizer, and a second fluorescent emissive material;
a hole transport layer located on a side of the first light-emitting layer away from the second light-emitting layer; and
an electron transport layer located on a side of the second light-emitting layer away from the first light-emitting layer, wherein
transmission rates of the material of the first light-emitting layer and the material of the second light-emitting layer to holes are both greater than transmission rates of the material of the first light-emitting layer and the material of the second light-emitting layer to electrons, and a normalized electroluminescence spectrum of the first TADF sensitizer and a normalized absorption spectrum of the second fluorescent emissive material have a first overlapping region therebetween;
wherein a lowest singlet energy of the second host material, a lowest singlet energy of the second TADF sensitizer, a lowest singlet energy of the second fluorescent emissive material, and a lowest triplet energy of the second host material, a lowest triplet energy of the second TADF sensitizer, and a lowest triplet energy of the second fluorescent emissive material meet:

$S1(D)-T1(D)>0.2$ eV;

$S1(E)-T1(E)<0.2$ eV;

$S1(F)-T1(F)>0.2$ eV;

$S1(D)>S1(E)>S1(F)$; and $T1(D)>T1(E)>T1(F)$, wherein S1 represents a lowest singlet energy, T1 represents a lowest triplet energy, D represents the second host material, E represents the second TADF sensitizer, and F represents the second fluorescent emissive material.

2. The light-emitting device according to claim 1, wherein an area of the first overlapping region is greater than 70% of an area of the normalized absorption spectrum of the second fluorescent emissive material;
and/or
a difference between a peak wavelength of an absorption peak with a lowest energy in the normalized absorption spectrum of the second fluorescent emissive material and a peak wavelength of an emission peak with a highest energy in the normalized electroluminescence spectrum of the first TADF sensitizer is less than or equal to 25 nm.

3. The light-emitting device according to claim 1, wherein the first TADF sensitizer and the second TADF sensitizer are the same; or
the first TADF sensitizer B and the second TADF sensitizer E are different, a normalized electroluminescence spectrum of the second TADF sensitizer and the normalized absorption spectrum of the second fluorescent emissive material have a second overlapping region therebetween.

4. The light-emitting device according to claim 3, wherein an area of the second overlapping region is greater than 70% of an area of the normalized absorption spectrum of the second fluorescent emissive material;
and/or
a difference between a peak wavelength of an absorption peak with a lowest energy in the normalized absorption spectrum of the second fluorescent emissive material and a peak wavelength of an emission peak with a highest energy in the normalized electroluminescence spectrum of the second TADF sensitizer is less than or equal to 25 nm.

5. The light-emitting device according to claim 1, wherein wavelengths corresponding to peak wavelengths of emission peaks with highest energy of the second host material, the second TADF sensitizer, and the second fluorescent emissive material meet:

$$\lambda(D) > \lambda(E) > \lambda(F),$$

wherein λ represents a wavelength.

6. The light-emitting device according to claim 1, wherein a highest occupied molecular orbital (HOMO) energy level of the second host material and a HOMO energy level of the second TADF sensitizer, and a lowest unoccupied molecular orbital (LUMO) energy level of the second host material and a LUMO energy level of the second TADF sensitizer meet:

$$|HOMO|(D) - |HOMO|(E) < 0.2 \text{ eV};$$

$$|LUMO|(D) - |LUMO|(E) > 0.3 \text{ eV};$$

and/or
a HOMO energy level of the first host material and a HOMO energy level of the first TADF sensitizer, and a LUMO energy level of the first host material and a LUMO energy level of the first TADF sensitizer meet:

$$|HOMO|(A) - |HOMO|(B) < 0.2 \text{ eV}; \text{ and}$$

$$|LUMO|(B) - |LUMO|(A) > 0.3 \text{ eV},$$

wherein |HOMO| represents an absolute value of a HOMO energy level, |LUMO| represents an absolute value of a LUMO energy level, A represents the first host material, and B represents the first TADF sensitizer.

7. The light-emitting device according to claim 1, wherein the second host material and the second TADF sensitizer meet following relations:

$$||HOMO|(D) - |LUMO|(E) - S1(E)| \leq 0.2 \text{ eV};$$

$$||HOMO|(D) - |LUMO|(E) - T1(E)| \leq 0.2 \text{ eV};$$

and/or
the first host material and the first TADF sensitizer meet following relations:

$$||HOMO|(A) - |LUMO|(B) - S1(B)| \leq 0.2 \text{ eV}; \text{ and}$$

$$||HOMO|(A) - |LUMO|(B) - T1(B)| \leq 0.2 \text{ eV}.$$

wherein |HOMO| represents an absolute value of a highest occupied molecular orbital (HOMO) energy level, |LUMO| represents an absolute value of a lowest unoccupied molecular orbital (LUMO) energy level, A represents the first host material, and B represents the first TADF sensitizer.

8. The light-emitting device according to claim 1, wherein the second host material and the first TADF sensitizer meet following relations:

$$||HOMO|(D) - |LUMO|(B) - S1(B)| \leq 0.2 \text{ eV};$$

$$||HOMO|(D) - |LUMO|(B) - T1(B)| \leq 0.2 \text{ eV};$$

and/or
the first host material and the second TADF sensitizer meet following relations:

$$||HOMO|(A) - |LUMO|(E) - S1(E)| \leq 0.2 \text{ eV}; \text{ and}$$

$$||HOMO|(A) - |LUMO|(E) - T1(E)| \leq 0.2 \text{ eV},$$

wherein |HOMO| represents an absolute value of a highest occupied molecular orbital (HOMO) energy level, |LUMO| represents an absolute value of a lowest unoccupied molecular orbital (LUMO) energy level, A represents the first host material, and B represents the first TADF sensitizer.

9. The light-emitting device according to claim 1, wherein the first host material and the second host material are the same, the first TADF sensitizer and the second TADF sensitizer are the same, and a mass ratio of the first TADF sensitizer to the first host material is less than a mass ratio of the second TADF sensitizer to the second host material.

10. The light-emitting device according to claim 1, wherein
the first TADF sensitizer and the second TADF sensitizer are different, a lowest triplet energy of the first TADF sensitizer and a lowest triplet energy of the second TADF sensitizer, and a lowest singlet energy of the first TADF sensitizer and a lowest singlet energy of the second TADF sensitizer meet:

$$|T1(E) - T1(B)| < 0.2 \text{ eV};$$

$$|S1(E) - S1(B)| < 0.2 \text{ eV};$$

wherein B represents the first TADF sensitizer;
and/or
under same test conditions, a luminous efficiency of a luminescence system composed of the first host material and the first TADF sensitizer is greater than a luminous efficiency of a luminescence system composed of the second host material and the second TADF sensitizer.

11. The light-emitting device according to claim 1, wherein
the first light-emitting layer further includes a first fluorescent emissive material;
a lowest singlet energy of the first host material, a lowest singlet energy of the first TADF sensitizer, a lowest singlet energy of the first fluorescent emissive material, a lowest triplet energy of the first host material, a lowest triplet energy of the first TADF sensitizer, and a lowest triplet energy of the first fluorescent emissive material meet:

$S1(A)-T1(A)>0.2$ eV;

$S1(B)-T1(B)<0.2$ eV;

$S1(C)-T1(C)>0.2$ eV;

$S1(A)>S1(B)>S1(C)$;

$T1(A)>T1(B)>T1(C)$;

wherein A represents the first host material, B represents the first TADF sensitizer, and C represents the first fluorescent emissive material;
the first fluorescent emissive material and the second fluorescent emissive material are the same, the second TADF sensitizer and the first TADF sensitizer are the same, the first host material and the second host material are the same, and a mass percentage of the first fluorescent emissive material in the first light-emitting layer is greater than a mass percentage of the second fluorescent emissive material in the second light-emitting layer.

12. The light-emitting device according to claim 11, wherein
a difference between the mass percentage of the first fluorescent emissive material in the first light-emitting layer and the mass percentage of the second fluorescent emissive material in the second light-emitting layer is greater than or equal to 0.1%.

13. The light-emitting device according to claim 11, wherein
the mass percentage of the first fluorescent emissive material in the first light-emitting layer is within a range of 0.5% to 3%, inclusive, and the mass percentage of the second fluorescent emissive material in the second light-emitting layer is within a range of 0.5% to 3%, inclusive.

14. The light-emitting device according to claim 1, wherein
a thickness of the first light-emitting layer is less than a thickness of the second light-emitting layer.

15. The light-emitting device according to claim 1, further comprising:
a hole blocking layer located between the electron transport layer and the second light-emitting layer; and/or,
an electron blocking layer located between the hole transport layer and the first light-emitting layer.

16. The light-emitting device according to claim 15, wherein
in a case where the light-emitting device comprises the electron blocking layer, a lowest triplet energy of the electron blocking layer is greater than a lowest triplet energy of the first TADF sensitizer, and a difference between the lowest triplet energy of the electron blocking layer and the lowest triplet energy of the first TADF sensitizer is greater than 0.2 eV; and
in a case where the light-emitting device comprises the hole blocking layer, a lowest triplet energy of the hole blocking layer is greater than a lowest triplet energy of the second TADF sensitizer, and a difference between the lowest triplet energy of the hole blocking layer and the lowest triplet energy of the second TADF sensitizer is greater than 0.2 eV.

17. The light-emitting device according to claim 15, wherein
in a case where the light-emitting device comprises the hole blocking layer, an absolute value of a highest occupied molecular orbital (HOMO) energy level of the hole blocking layer is greater than an absolute value of a HOMO energy level of the second host material by 0.2 eV; and
in a case where the light-emitting device comprises the electron blocking layer, an energy level difference between a HOMO energy level of the electron blocking layer and a HOMO energy level of the first host material is less than or equal to 0.2 eV.

18. A light-emitting substrate, comprising the light-emitting device according to claim 1.

19. A light-emitting apparatus, comprising the light-emitting substrate according to claim 18.

20. A method for manufacturing a light-emitting device, the method comprising:
forming a hole transport layer, a first light-emitting layer, a second light-emitting layer, and an electron transport layer that are sequentially stacked, wherein
a material of the first light-emitting layer includes a first host material and a first TADF sensitizer; the second light-emitting layer includes a second host material, a second TADF sensitizer, and a second fluorescent emissive material;
transmission rates of the material of the first light-emitting layer and a material of the second light-emitting layer to holes are greater than transmission rates of the material of the first light-emitting layer and the material of the second light-emitting layer to electrons, and a normalized electroluminescence spectrum of the second fluorescent emissive material and a normalized absorption spectrum of the first TADF sensitizer have a first overlapping region therebetween; and
a lowest singlet energy of the second host material, a lowest singlet energy of the second TADF sensitizer, a lowest singlet energy of the second fluorescent emissive material, and a lowest triplet energy of the second host material, a lowest triplet energy of the second TADF sensitizer, and a lowest triplet energy of the second fluorescent emissive material meet:

$S1(D)-T1(D)>0.2$ eV;

$S1(E)-T1(E)<0.2$ eV;

$S1(F)-T1(F)>0.2$ eV;

$S1(D)>S1(E)>S1(F)$; and $T1(D)>T1(E)>T1(F)$, wherein S1 represents a lowest singlet energy, T1 represents a lowest triplet energy, D represents the second host material, E represents the second TADF sensitizer, and F represents the second fluorescent emissive material.

\* \* \* \* \*